(12) United States Patent
Yamaguchi

(10) Patent No.: US 11,839,094 B2
(45) Date of Patent: *Dec. 5, 2023

(54) SOLID-STATE IMAGING ELEMENT, PRODUCTION METHOD THEREOF, AND ELECTRONIC DEVICE

(71) Applicant: SONY GROUP CORPORATION, Tokyo (JP)

(72) Inventor: Tetsuji Yamaguchi, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/550,897

(22) Filed: Dec. 14, 2021

(65) Prior Publication Data

US 2022/0181567 A1 Jun. 9, 2022

Related U.S. Application Data

(63) Continuation of application No. 16/113,190, filed on Aug. 27, 2018, now Pat. No. 11,233,210, which is a
(Continued)

(30) Foreign Application Priority Data

Sep. 2, 2013 (JP) ................ 2013-181248

(51) Int. Cl.
*H10K 30/10* (2023.01)
*H01L 27/146* (2006.01)
(Continued)

(52) U.S. Cl.
CPC ....... *H10K 30/10* (2023.02); *H01L 27/14623* (2013.01); *H01L 27/14632* (2013.01);
(Continued)

(58) Field of Classification Search
CPC ........ H10K 30/10; H10K 30/82; H10K 30/87; H01L 27/14623; H01L 27/14636; H01L 27/14625; H01L 27/14665
See application file for complete search history.

(56) References Cited

U.S. PATENT DOCUMENTS 7,760,254 B2 7/2010 Suzuki
9,882,154 B2 1/2018 Yamaguchi
(Continued)

FOREIGN PATENT DOCUMENTS

JP 2011-029337 2/2011
JP 2011-029932 2/2011
(Continued)

OTHER PUBLICATIONS

International Search Report and Written Opinion prepared by the European Patent Office dated Nov. 19, 2014, for International Application No. PCT/JP2014/004381.
(Continued)

*Primary Examiner* — Tuan A Hoang
(74) *Attorney, Agent, or Firm* — Sheridan Ross PC

(57) ABSTRACT

A solid-state imaging element including a phase difference detection pixel pair that includes first and second phase difference detection pixels is provided. In particular, each phase difference detection pixel of the first and second phase difference detection pixels includes a first photoelectric conversion unit arranged at an upper side of a semiconductor substrate and a second photoelectric conversion unit arranged within the semiconductor substrate. The first photoelectric conversion film may be an organic film. In addition, phase difference detection pixels may be realized without using a light shielding film.

22 Claims, 24 Drawing Sheets

Related U.S. Application Data continuation of application No. 15/087,884, filed on Mar. 31, 2016, now Pat. No. 10,566,557, which is a continuation of application No. 14/895,735, filed as application No. PCT/JP2014/004381 on Aug. 26, 2014, now Pat. No. 9,882,154.

(51) Int. Cl.
  *H04N 25/75* (2023.01)
  *H04N 25/76* (2023.01)
  *H10K 30/82* (2023.01)
  *H10K 30/87* (2023.01)

(52) U.S. Cl.
  CPC .. *H01L 27/14636* (2013.01); *H01L 27/14647* (2013.01); *H01L 27/14687* (2013.01); *H04N 25/75* (2023.01); *H04N 25/76* (2023.01); *H10K 30/82* (2023.02); *H10K 30/87* (2023.02)

(56) References Cited

U.S. PATENT DOCUMENTS

| | | | |
|---|---|---|---|
| 10,566,557 B2 | 2/2020 | Yamaguchi | |
| 11,233,210 B2 | 1/2022 | Yamaguchi | |
| 2006/0196533 A1* | 9/2006 | Maehara | H10K 39/32 136/243 |
| 2009/0050947 A1* | 2/2009 | Dungan | H01L 27/14625 257/E31.128 |
| 2011/0019042 A1* | 1/2011 | Yamaguchi | H01L 27/14632 257/E31.127 |
| 2011/0109776 A1* | 5/2011 | Kawai | H04N 25/76 348/294 |
| 2011/0216212 A1 | 9/2011 | Watanabe et al. | |
| 2011/0273602 A1* | 11/2011 | Takamiya | H04N 25/778 348/E5.091 |
| 2011/0279727 A1 | 11/2011 | Kusaka | |
| 2013/0182173 A1 | 7/2013 | Hironobu | |
| 2014/0176771 A1 | 6/2014 | Itou | |
| 2015/0195466 A1* | 7/2015 | Takase | H01L 27/14621 348/294 |

FOREIGN PATENT DOCUMENTS

| | | |
|---|---|---|
| JP | 2011-103335 | 5/2011 |
| JP | 2011-138927 | 7/2011 |
| JP | 2011-171749 | 9/2011 |
| JP | 2013-135123 | 7/2013 |
| JP | 2013-145292 | 7/2013 |
| KR | 20110076769 A | 7/2011 |
| WO | WO 2013/031537 | 3/2013 |

OTHER PUBLICATIONS

Official Action (no English translation available) for Japanese Patent Application No. 2013-181248 dated Dec. 6, 2016, 14 pages.
Official Action (with English translation) for Chinese Patent Application No. 201480029010.6, dated May 16, 2018, 15 pages.
Official Action (with English translation) for Korea Patent Application No. 10-2015-7033322, dated Feb. 1, 2021, 13 pages.
Official Action for U.S. Appl. No. 14/895,735, dated May 18, 2017, 11 pages.
Notice of Allowance for U.S. Appl. No. 14/895,735, dated Sep. 12, 2017, 8 pages.
Official Action for U.S. Appl. No. 15/087,884, dated Aug. 29, 2016, 8 pages. Restriction Requirement.
Official Action for U.S. Appl. No. 15/087,884, dated Feb. 6, 2017, 20 pages.
Official Action for U.S. Appl. No. 15/087,884, dated Jun. 2, 2017, 22 pages.
Official Action for U.S. Appl. No. 15/087,884, dated Feb. 16, 2018, 21 pages.
Official Action for U.S. Appl. No. 15/087,884, dated Sep. 26, 2018, 21 pages.
Official Action for U.S. Appl. No. 15/087,884, dated Feb. 14, 2019, 8 pages.
Official Action for U.S. Appl. No. 15/087,884, dated Jun. 18, 2019, 8 pages.
Notice of Allowance for U.S. Appl. No. 15/087,884, dated Oct. 11, 2019, 9 pages.
Notice of Allowance for U.S. Appl. No. 15/087,884, dated Dec. 19, 2019, 6 pages.
Official Action for U.S. Appl. No. 16/113,190, dated Apr. 17, 2019, 20 pages.
Official Action for U.S. Appl. No. 16/113,190, dated Sep. 5, 2019, 17 pages.
Official Action for U.S. Appl. No. 16/113,190, dated Feb. 27, 2020, 23 pages.
Official Action for U.S. Appl. No. 16/113,190, dated Jun. 29, 2020, 19 pages.
Official Action for U.S. Appl. No. 16/113,190, dated Oct. 6, 2020, 21 pages.
Official Action for U.S. Appl. No. 16/113,190, dated Jan. 21, 2021, 19 pages.
Official Action for U.S. Appl. No. 16/113,190, dated Jun. 1, 2021, 22 pages.
Notice of Allowance for U.S. Appl. No. 16/113,190, dated Sep. 20, 2021, 11 pages.

* cited by examiner

SOLID-STATE IMAGING ELEMENT, PRODUCTION METHOD THEREOF, AND ELECTRONIC DEVICE

CROSS REFERENCE TO RELATED APPLICATIONS

This application is a continuation of U.S. patent application Ser. No. 14/895,735, filed Dec. 3, 2015, which is a national stage application under 35 U.S.C. 371 and claims the benefit of PCT Application No. PCT/JP2014/004381, filed Aug. 26, 2014, which claims the benefit of Japanese Priority Patent Application JP 2013-181248 filed on Sep. 2, 2013, the entire contents of which are incorporated herein by reference.

TECHNICAL FIELD

The present disclosure relates to a solid-state imaging element, a production method thereof, and an electronic device. Specifically, the present disclosure relates to a solid-state imaging element, a production method thereof, and an electronic device, which make it possible to form a focus detection pixel of a solid-state imaging element in which a photoelectric conversion unit is formed at an upper side of a semiconductor layer.

BACKGROUND ART

A recent CMOS image sensor has employed a method to use, as an autofocus function of a camera, a focus detection pixel having asymmetric sensitivity to an incident angle of light. As a method to realize a focus detection pixel, a method to arrange a pixel pair having a first pixel in which a right half thereof is opened by a light shielding film, and a second pixel, in which a left half thereof is opened, has been provided (see, for example, JP 2009-99817 A and JP 2011-171749 A). The method is similar to both of an image sensor of a surface irradiation type and an image sensor of a rear surface irradiation type. Also, to increase asymmetry of sensitivity of a focus detection pixel, a light shielding film is formed in the vicinity of a silicon layer to which a photodiode is formed, as close as possible.

CITATION LIST

Patent Literature

[PTL 1]
JP 2009-99817 A
[PTL 2]
JP 2011-171749 A

SUMMARY OF INVENTION

Technical Problem

Such a method to realize a focus detection pixel has been used for a photodiode formed in a silicon layer.

Recently, an image sensor in which a photoelectric conversion film is laminated on an upper side of a silicon layer and a longitudinal-direction spectral image sensor having both a photoelectric conversion layer formed at an upper side of a silicon layer and a photodiode formed in a silicon layer, have been developed. Thus, a preferable method to form a focus detection pixel thereto has been desired.

In the view of forgoing, the present disclosure describes a focus detection pixel of a solid-state imaging element in which a photoelectric conversion unit is formed at an upper side of a semiconductor layer.

Solution to Problem

A solid-state imaging element of a first aspect of the present disclosure includes: a phase difference detection pixel pair including first and second phase difference detection pixels, each phase difference detection pixel of the first and second phase difference detection pixels including a first photoelectric conversion unit arranged at an upper side of a semiconductor substrate and a second photoelectric conversion unit arranged within the semiconductor substrate, wherein the first photoelectric conversion unit includes a first photoelectric conversion film sandwiched between an upper electrode and a lower electrode.

An electronic device of a second aspect of the present disclosure includes: a solid state imaging element including a phase difference detection pixel pair including first and second phase difference detection pixels, each phase difference detection pixel of the first and second phase difference detection pixels including a first photoelectric conversion unit arranged at an upper side of a semiconductor substrate and a second photoelectric conversion unit arranged within the semiconductor substrate, wherein the first photoelectric conversion unit includes a first photoelectric conversion film sandwiched between an upper electrode and a lower electrode; and an optical unit configured to receive incident light and form an image on an imaging surface of the solid-state imaging element.

A method of manufacturing of a third aspect of the present disclosure includes: forming a plurality of first photoelectric conversion units within a semiconductor substrate, the first photoelectric conversion units configured to photoelectrically convert a first wavelength of light; forming a plurality of second photoelectric conversion units above the semiconductor substrate, wherein the plurality of second photoelectric conversion units are configured to photoelectrically convert a second wavelength of light.

Each of the solid-state imaging element and the electronic device may be an independent apparatus or a module embedded into a different apparatus.

Advantageous Effects of Invention

According to the first to third aspects of the present disclosure, a focus detection pixel can be formed on a solid-state imaging element in which a photoelectric conversion unit is formed on an upper side of a semiconductor layer.

Note that effects are not limited to what has been described here and may be any affects described in the present disclosure.

DESCRIPTION OF EMBODIMENTS

The following is a description of modes (hereinafter referred to as embodiments) for carrying out the present disclosure. Description will be made in the following order.
1. Schematic Configuration Example of a Solid-State Imaging Element
2. Phase Difference Pixel of a First Embodiment (configuration in which a shape of a lower electrode is changed)
3. Phase Difference Pixel of a Second Embodiment (configuration in which a lower electrode for discharge is included)
4. Phase Difference Pixel of a Third Embodiment (configuration in which an interlayer film is formed between a photoelectric conversion film and a lower electrode)
5. Phase Difference Pixel of a Fourth Embodiment (modified example of the first embodiment)
6. Phase Difference Pixel of a Fifth Embodiment (modified example of the second embodiment)
7. Phase Difference Pixel of a Sixth Embodiment (modified example of the third embodiment)
8. Phase Difference Pixel of a Seventh Embodiment (configuration in which a light shielding film is included on the photodiode)
9. Phase Difference Pixel of an Eighth Embodiment (configuration in which a photodiode region is changed)
10. Phase Difference Pixel of a Ninth Embodiment (first configuration in which a light shielding film is formed on the photoelectric conversion film)
11. Phase Difference Pixel of a Tenth Embodiment (second configuration in which a light shielding film is formed on the photoelectric conversion film)
12. Phase Difference Pixel of an Eleventh Embodiment (first configuration in which a phase difference signal is generated by infrared light)
13. Phase Difference Pixel of a Twelfth Embodiment (second configuration in which a phase difference signal is generated by infrared light)
14. Production Method of the First Embodiment
15. Production Method of the Second Embodiment
16. Production Method of the Ninth Embodiment
17. Arrangement Example of a Light Shielding Film
18. Application Example for an Electronic device 1. Schematic Configuration Example of a Solid-State Imaging Element FIG. 1 depicts a schematic configuration of a solid-state imaging element according to an embodiment of the present disclosure.

Figure 1:
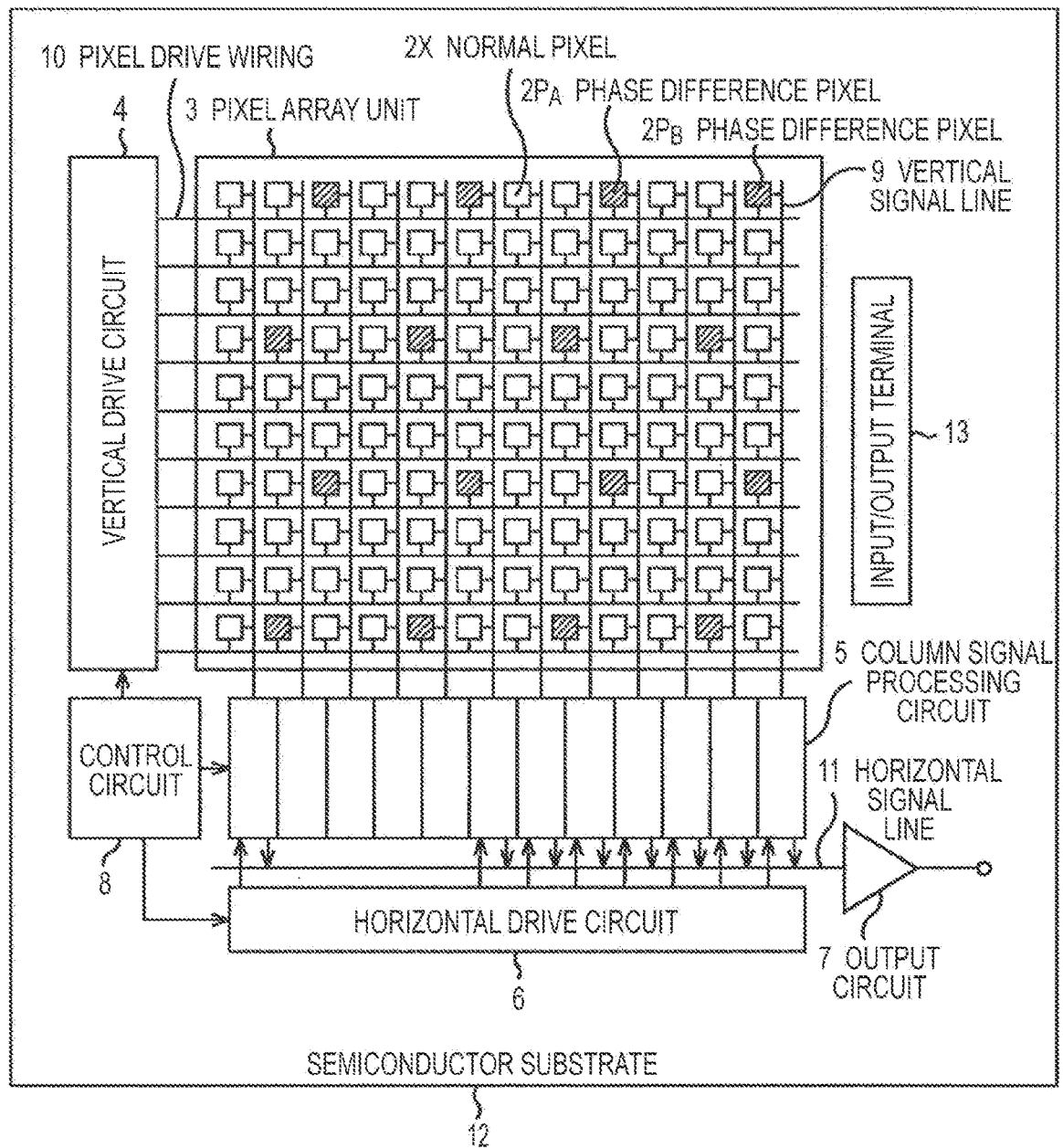
FIG. 1 is a view illustrating a schematic configuration of a solid-state imaging element according to an embodiment of the present disclosure.

The solid-state imaging element 1 in FIG. 1 includes a pixel array unit 3, in which pixels 2 are two-dimensionally arranged in a matrix on a semiconductor substrate 12 including, for example, silicon (Si) as a semiconductor, and a peripheral circuit unit which is in a periphery of the pixel array unit 3. The peripheral circuit unit includes a vertical drive circuit 4, a column signal processing circuit 5, a horizontal drive circuit 6, an output circuit 7, a control circuit 8, and the like.

In the pixel array unit 3, as the pixels 2 are arranged two-dimensionally in a matrix, there is a normal pixel 2X that generates an image generation signal and there is a phase difference pixel 2P that generates a focus detection signal. The phase difference pixel 2P may also be referred to as a phase difference detection pixel 2P. In addition, the phase difference pixel 2P is divided into a phase difference pixel $2P_A$ of a type A and a phase difference pixel $2P_B$ of a type B. The phase difference pixel $2P_A$ of the type A and the phase difference pixel $2P_B$ of the type B may each be referred to as first and second phase difference detection pixels.

The phase difference pixel $2P_A$ of the type A and the phase difference pixel $2P_B$ of the type B are configured to have asymmetric sensitivity to an incident angle of light, and are arranged in a pair on the pixel array unit 3. For example, in a case where a shielding direction is a right-left direction (horizontal direction), compared to the normal pixel 2X, the phase difference pixel $2P_A$ of the type A is a pixel in which a right half of a light receiving surface of a photoelectric conversion unit (such as photodiode) is shielded, and the phase difference pixel $2P_B$ of the type B is a pixel in which a left half is shielded.

In the pixel array unit 3, a portion of the normal pixels 2X, which are two-dimensionally arranged, is replaced by the phase difference pixels $2P_A$ or the phase difference pixels $2P_B$. In the example in FIG. 1, the phase difference pixel $2P_A$ and the phase difference pixel $2P_B$ are arranged in a horizontal direction, but a pair of the phase difference pixel $2P_A$ and the phase difference pixel $2P_B$ is arranged arbitrarily and may be arranged, for example, in a vertical direction.

Between a pixel signal from the type A and a pixel signal from the type B, a shift of an image is generated due to a difference in the position of the openings. For example, in a case where an opening direction is a right-left direction (horizontal direction), compared to the normal pixel 2X, the phase difference pixel $2P_A$ of the type A is a pixel in which a left half of a light receiving surface of a photoelectric conversion unit (such as photodiode) is open, and the phase difference pixel $2P_B$ of the type B is a pixel in which a right half is open. Based on the shift of an image, a phase shift amount is calculated to determine an amount of defocusing, or a defocusing amount, and a photographing lens is adjusted (moved), whereby autofocus can be performed.

The pixel 2 includes a photodiode as a photoelectric conversion element and a plurality of pixel transistors (so-called MOS transistor). The plurality of pixel transistors includes, for example, four MOS transistors such as a transfer transistor, a selection transistor, a reset transistor, and an amplifier transistor.

Also, the pixels 2 may have a shared pixel structure. The shared pixel structure may include a plurality of photodiodes, a plurality of transfer transistors, one shared floating diffusion (floating diffusion region), and each of other shared pixel transistors. That is, in the shared pixel, the photodiodes and the transfer transistors, which configure a plurality of unit pixels, share each of the other pixel transistors.

The control circuit 8 receives an input clock and data to instruct an operation mode and the like, and outputs data such as internal information of the solid-state imaging element 1. That is, based on a vertical synchronizing signal, a horizontal synchronizing signal, and a master clock, the control circuit 8 generates a clock signal and a control signal which are the bases of operations of the vertical drive circuit 4, the column signal processing circuit 5, and the horizontal drive circuit 6. Then, the control circuit 8 outputs the generated clock signal and control signal to the vertical drive circuit 4, the column signal processing circuit 5, horizontal drive circuit 6, or the like.

The vertical drive circuit 4 includes, for example, a shift register. The vertical drive circuit 4 selects pixel drive wiring 10 and supplies, to the selected pixel drive wiring 10, a pulse to drive the pixels 2 and drives the pixels 2 in a row unit. That is, the vertical drive circuit 4 selects and scans, serially in a vertical direction in a row unit, each of the pixels 2 in the pixel array unit 3. Then, the vertical drive circuit 4 supplies, to the column signal processing circuit 5 through a vertical signal line 9, a pixel signal based on signal charge generated, according to the quantity of received light, in a photoelectric conversion unit of each of the pixels 2.

The column signal processing circuit 5 is arranged at each column of the pixels 2, and performs, for each pixel column, signal processing, such as noise removal, on the signals output by the pixels 2 in one row. For example, the column signal processing circuit 5 performs signal processing such as correlated double sampling (CDS) to remove unique fixed pattern noise of a pixel, and AD conversion.

The horizontal drive circuit 6 includes, for example, a shift register. The horizontal drive circuit 6 serially outputs a horizontal scanning pulse to serially select each of the column signal processing circuits 5, and makes each of the column signal processing circuits 5 output a pixel signal to a horizontal signal line 11.

The output circuit 7 performs signal processing on the signals serially supplied by the column signal processing circuits 5 through the horizontal signal line 11, and outputs the processed signals. For example, the output circuit 7 may only perform buffering, or may perform adjustment of a black level, correction of column variation, various kinds of digital signal processing, and the like. The input/output terminal 13 exchanges signals with an external unit.

The solid-state imaging element 1 may be configured as a CMOS image sensor called a column AD type, in which a column signal processing circuit 5 to perform CDS processing and AD conversion processing is arranged at each pixel column.

2. Phase Difference Pixel of a First Embodiment

In the following, sectional configurations of the normal pixel 2X, the phase difference pixel $2P_A$, and the phase difference pixel $2P_B$ of the solid-state imaging element 1 will be described in detail.

Figure 2:
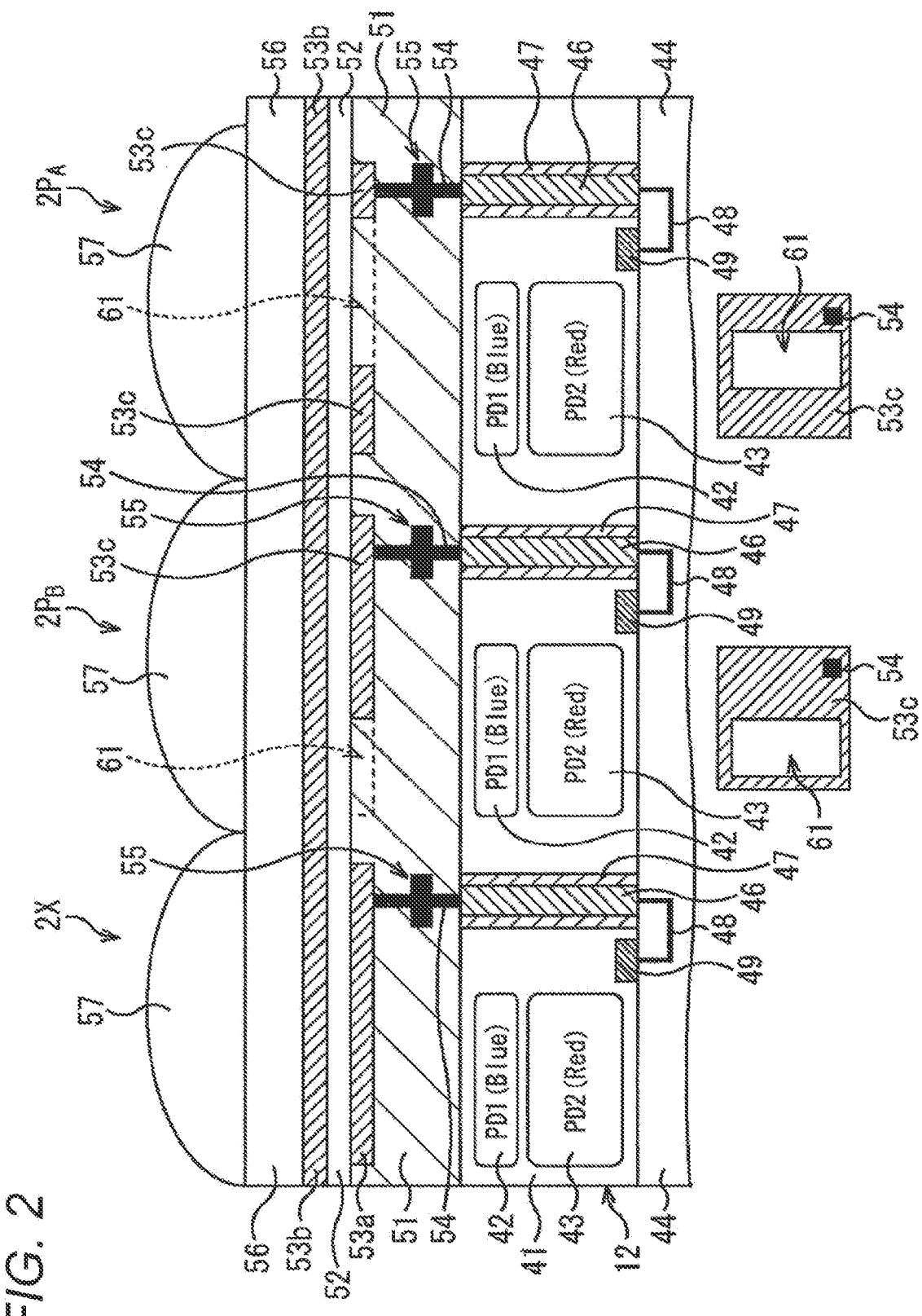
FIG. 2 is a sectional configuration view illustrating a phase difference pixel of a first embodiment.

FIG. 2 illustrates sectional configurations of the normal pixel 2X, the phase difference pixel $2P_A$, and the phase difference pixel $2P_B$ of the solid-state imaging element 1 in FIG. 1; FIG. 1 also illustrates a phase difference pixel 2P of the first embodiment.

Note that in FIG. 2, as a matter of convenience, the normal pixel 2X, the phase difference pixel $2P_B$, and the phase difference pixel $2P_A$ are aligned and arranged serially from a left side in a horizontal direction (right-left direction).

In the description of FIG. 2, first, a structure of the normal pixel 2X will be described, and then, the phase difference pixel $2P_A$ and the phase difference pixel $2P_B$ will be described with respect to a part different from the normal pixel 2X.

In a first conductivity type (such as p-type) semiconductor region 41 of the semiconductor substrate 12, second conductivity type (such as n-type) semiconductor regions 42 and 43 are laminated and formed in a depth direction. Thus, photodiodes PD1 and PD2 of p-n junction are formed in the depth direction. The photodiode PD1, including the semiconductor region 42 as a charge accumulation region is an inorganic photoelectric conversion unit configured to receive and to photoelectrically convert blue light. The photodiode PD2, including the semiconductor region 43 as a charge accumulation region is an inorganic photoelectric conversion unit configured to receive and to photoelectrically convert red light.

On a surface side (lower side in the drawing) of the semiconductor substrate 12, a plurality of pixel transistors are formed, for example, to read charge accumulated in the photodiodes PD1 and PD2. In addition, at the surface side (lower side in the drawing) of the semiconductor substrate 12, a multi-layer wiring layer 44 including a plurality of wiring layers and interlayer insulating films is formed. Note that in FIG. 2, the multi-layer wiring layer 44 is not illustrated in detail.

In the semiconductor substrate 12, a conductive plug 46 is formed to take out the charge converted photoelectrically in an organic photoelectric conversion film 52, which will be described later. The conductive plug 46 is formed at a side of the multi-layer wiring layer 44 and penetrates (semiconductor region 41) the semiconductor substrate 12. At an outer periphery of the conductive plug 46, an insulating film 47, such as SiO2 or SiN, is formed to control a short-circuit with the semiconductor region 41.

The conductive plug 46 is connected, by metal wiring 48 formed in the multi-layer wiring layer 44, to a floating diffusion unit (FD unit) 49 formed of the second conductivity type (such as n-type) in the first conductivity type (such as p-type) semiconductor region in the semiconductor substrate 12. The FD unit 49 is a region configured to temporally hold the charge photoelectrically converted in the organic photoelectric conversion film 52 until the charge is read.

At an interface of a rear surface side (upper side in the drawing) of the semiconductor substrate 12, for example, a transparent insulating film 51 including two or three layers of a hafnium oxide (HfO2) film and a silicon oxide film is formed.

On an upper side of the transparent insulating film 51, the organic photoelectric conversion film 52 is arranged, the organic photoelectric conversion film 52 being sandwiched by a lower electrode 53a and an upper electrode 53b. The lower electrode 53a is on a lower side of the organic photoelectric conversion film 52 and the upper electrode 53b is on an upper side thereof. The organic photoelectric conversion film 52, the lower electrode 53a, and the upper electrode 53b configure an organic photoelectric conversion unit. The organic photoelectric conversion film 52 is formed as a film to convert green wavelength light photoelectrically, and includes, for example, an organic photoelectric conversion material which includes rhodamine-based pigment, merocyanine-based pigment, quinacridone, or the like. The lower electrode 53a and the upper electrode 53b include, for example, an indium tin oxide (ITO) film, an indium zinc oxide film, or the like.

Note that in a case where the organic photoelectric conversion film 52 is configured to convert red wavelength light photoelectrically, the organic photoelectric conversion film 52 may include, for example, an organic photoelectric conversion material including phthalocyanine-based pigment. Also, in a case where the organic photoelectric conversion film 52 is configured to convert blue wavelength light photoelectrically, the organic photoelectric conversion film 52 may include an organic photoelectric conversion material including coumarin-based pigment, tris-8-hydroxy-quinoline Al (Alq3), merocyanine-based pigment, or the like.

While the upper electrode 53b is formed on a whole surface and is common to all pixels, the lower electrode 53a is formed in a pixel unit. The lower electrode 53a is connected to the conductive plug 46 of the semiconductor substrate 12 by a metal wiring 54 which penetrates the transparent insulating film 51. The metal wiring 54 includes a material such as tungsten (W), aluminum (Al), or copper (Cu). The metal wiring 54 is formed in the transparent insulating film 51 also in a planar direction at a predetermined depth, and is also used as a light shielding film 55 between pixels to control incidence of light to an adjacent pixel. For example, the light shielding film 55 may prevent light from one pixel from reaching another pixel.

On an upper surface of the upper electrode 53b, a high refractive index layer 56 is formed by an inorganic film such as a silicon nitride film (SiN), a silicon oxynitride film (SiON), or a silicon carbide (SiC). Also, on the high refractive index layer 56, an on-chip lens 57 is formed. An example of a material of the on-chip lens 57 includes a silicon nitride film (SiN), and a resin material such as styrene-based resin, acrylic resin, styrene-acrylic copolymer resin, or siloxane-based resin. In the present pixel structure, a distance between the organic photoelectric conversion film 52 and the on-chip lens 57 becomes close, whereby the phase difference pixels $2P_A$ and $2P_B$ have low light incident angle dependency. Thus, the high refractive index layer 56 makes the angle of refraction large and improves light-condensing efficiency.

The normal pixel 2X is configured in such a manner.

Thus, the solid-state imaging element 1 in which the normal pixels 2X are arranged two-dimensionally is a CMOS solid-state imaging element of a rear surface irradiation type, in which light enters from the rear surface side, which is the opposite side of the surface side, on which a pixel transistor is formed, of the semiconductor substrate 12.

Also, the solid-state imaging element 1 is a solid-state imaging element of a longitudinal-direction spectral type. The solid-state imaging element 1 photoelectrically converts the green light in the organic photoelectric conversion film 52 formed on the upper side of the semiconductor substrate (silicon layer) 12 and photoelectrically converts the blue and red light in the photodiodes PD1 and PD2 in the semiconductor substrate 12.

Next, structures of the phase difference pixel $2P_A$ and the phase difference pixel $2P_B$ will be described. Note that in the description of the structures of the phase difference pixel $2P_A$ and the phase difference pixel $2P_B$, a part different from the normal pixel 2X will be described.

In the phase difference pixel $2P_A$ and the phase difference pixel $2P_B$, a photoelectric conversion region that includes the organic photoelectric conversion film 52 is modified from that in the normal pixel 2X. Thus, the phase difference pixels are realized without using a light shielding film.

That is, a photoelectric conversion region that includes the organic photoelectric conversion film 52 is a region sandwiched by a lower electrode 53c on the lower side of the organic photoelectric conversion film 52 and the upper electrode 53b on the upper side thereof. In each of the phase difference pixel $2P_A$ and the phase difference pixel $2P_B$, a formed region (shape) of the lower electrode 53c is different from that of the lower electrode 53a of the normal pixel 2X.

In a lower part of the sectional structure views of the phase difference pixel $2P_A$ and the phase difference pixel $2P_B$ in FIG. 2, plane views illustrating the photoelectric conversion regions thereof are illustrated.

To a substantially right half region of the lower electrode 53c of the phase difference pixel $2P_A$, an opening 61 is provided. To a substantially left half region of the lower electrode 53c of the phase difference pixel $2P_B$, an opening 61 is provided.

As described above, in each of the phase difference pixel $2P_A$ and the phase difference pixel $2P_B$, the photoelectric conversion region including the organic photoelectric conversion film 52, is the region sandwiched by the lower electrode 53c and the upper electrode 53b. Thus, an effect similar to that obtained by forming a light shielding film at the opening 61 of the lower electrode 53c is obtained. That is, by the structures of the phase difference pixel $2P_A$ and the phase difference pixel $2P_B$ illustrated in FIG. 2, G-signals for focus detection, which have an asymmetric sensitivity to a light incident angle, can be generated.

In such a manner, in the phase difference pixel 2P of the first embodiment, the photoelectric conversion region that includes the organic photoelectric conversion film 52 is modified from that in the normal pixel 2X, whereby the phase difference pixels are realized without using a light shielding film.

Thus, according to the phase difference pixel 2P of the first embodiment, since it is not necessary to form a light shielding film on an upper surface of the organic photoelectric conversion film 52, it is possible to realize a phase difference pixel in the solid-state imaging element 1 of a longitudinal-direction spectral type without increasing the number of processes and/or the number of steps in a manufacturing process.

Note that in the pixel structures illustrated in FIG. 2, since the green light is photoelectrically converted in the organic photoelectric conversion film 52, the G-signal output by the phase difference pixel 2P is used as a focus detection signal. However, the color of light converted photoelectrically in the organic photoelectric conversion film 52 can be arbitrarily selected. That is, in the solid-state imaging element of a longitudinal-direction spectral type, the color of light photoelectrically converted in the organic photoelectric conversion film 52 formed on the upper side of the semiconductor substrate 12 can be arbitrarily determined such that the color of light photoelectrically converted in the organic photoelectric conversion film 52 may be green, red, blue, or the like. Also, the color of light photoelectrically converted in the photodiodes PD1 and PD2 in the semiconductor substrate 12 can be arbitrarily determined.

3. Phase Difference Pixel of a Second Embodiment

Next, a phase difference pixel 2P of the second embodiment will be described with reference to FIG. 3.

Figure 3:
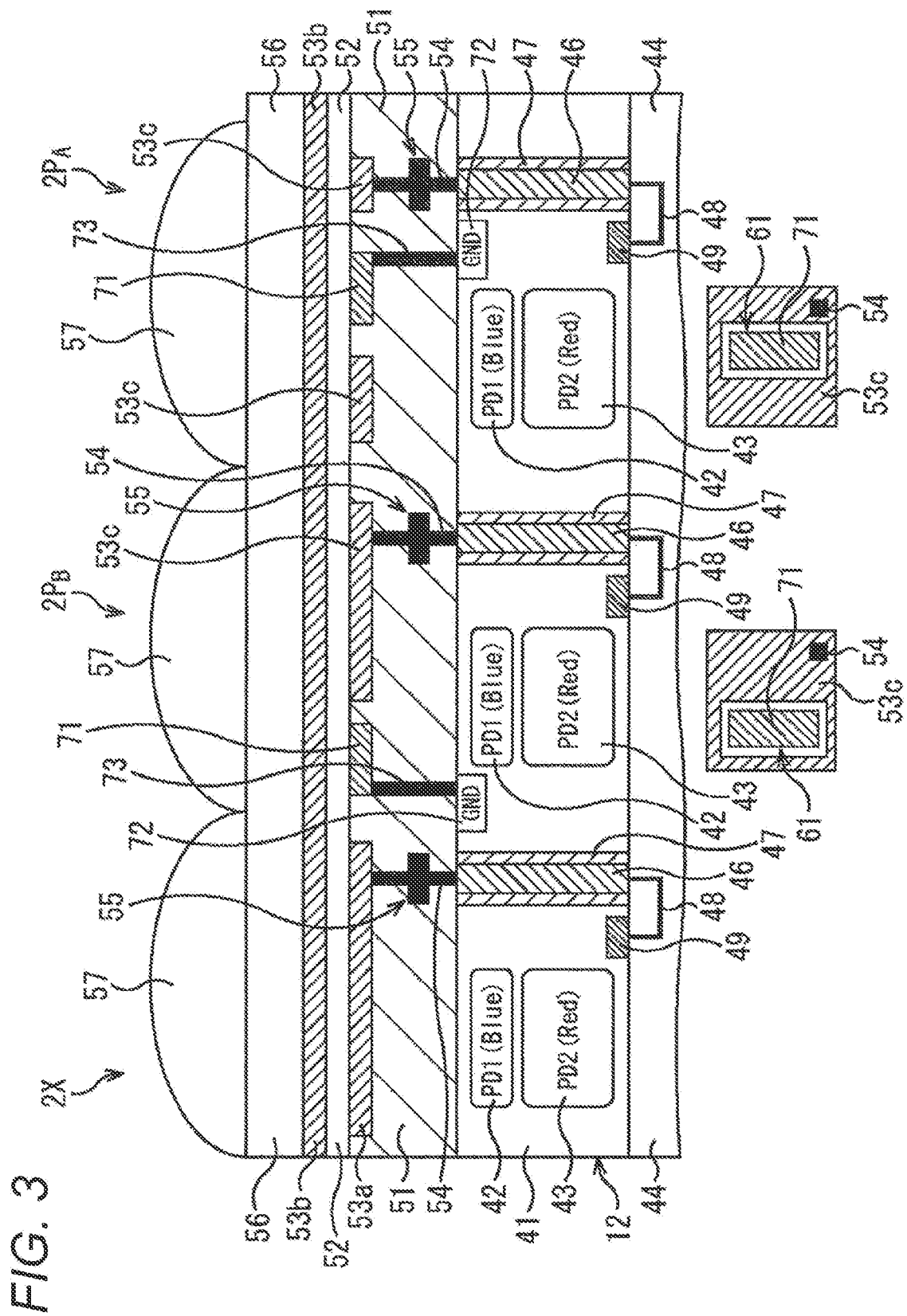
FIG. 3 is a sectional configuration view illustrating a phase difference pixel of a second embodiment.

In FIG. 3, similarly to FIG. 2, sectional configurations of a normal pixel 2X, a phase difference pixel $2P_A$, a phase difference pixel $2P_B$, and a plane view in a planar direction of a layer, in which a lower electrode 53c is formed, are illustrated.

In the description of FIG. 3 to FIG. 13, the same reference characters are assigned to parts corresponding to the other embodiments which have been described and the description thereof has been omitted.

The second embodiment is similar to the first embodiment in that a photoelectric conversion region that includes an organic photoelectric conversion film 52 is modified from that in the normal pixel 2X to realize a phase difference pixel.

However, in the second embodiment, as illustrated in the plane view in FIG. 3, a lower electrode 71 is formed in a portion of which is the opening 61 in the first embodiment.

Also, as illustrated in the sectional configuration view of FIG. 3, a semiconductor region 72 of a first conductivity type is formed at an interface, on a side of a transparent insulating film 51, in a first conductivity type semiconductor region 41 in a semiconductor substrate 12, and the semiconductor region 72 and the lower electrode 71 are connected to each other by metal wiring 73. The metal wiring 73 includes a material which is the same or similar to that of metal wiring 54. The semiconductor region 72 is set at GND potential.

In other words, in the second embodiment in FIG. 3, the lower electrode in the phase difference pixel 2P is divided into a lower electrode 53c and the lower electrode 71. Then, a signal from the lower electrode 53c is output as a focus detection signal, to a FD unit 49, through the metal wiring 54 and a conductive plug 46. A signal from the lower electrode 71 is discharged as an unnecessary signal, through the metal wiring 73, to the semiconductor region 72 at the GND potential.

By forming the lower electrode 71 at a region which is not used as a focus detection signal and further removing and/or discharging such a signal, unnecessary charge is prevented from being mixed into the lower electrode 53c and from being output as a focus detection signal. Thus, an accuracy of a phase difference detection signal may be improved.

Also, in the phase difference pixel 2P of the second embodiment illustrated in FIG. 3, it is not necessary to form a light shielding film at an upper surface of the organic photoelectric conversion film 52. Thus, in a solid-state imaging element 1 of a longitudinal-direction spectral type, a phase difference pixel can be realized without increasing the number of processes and/or the number of steps required during a manufacturing process.

4. Phase Difference Pixel of a Third Embodiment

Next, a phase difference pixel 2P of the third embodiment will be described with reference to FIG. 4.

The third embodiment is similar to the first embodiment in that a photoelectric conversion region that includes the organic photoelectric conversion film 52 is modified from that in a normal pixel 2X to realize a phase difference pixel. However, a manner of forming the photoelectric conversion region is different from that of the first embodiment.

In the third embodiment, on a lower side of the organic photoelectric conversion film 52, a lower electrode 53a, which is the same as that of the normal pixel 2X, is formed instead of the lower electrode 53c. Then, an interlayer film 81 is provided, utilizing a material which is the same as that of a transparent insulating film 51, between the organic photoelectric conversion film 52 and the lower electrode 53a. Thus, a photoelectric conversion region in the phase difference pixel 2P is modified from that of the normal pixel 2X.

The photoelectric conversion region is a region in which the organic photoelectric conversion film 52 is directly in contact with both of the lower electrode 53a and an upper electrode 53b. In a phase difference pixel $2P_A$, in a left half region thereof, the lower electrode 53a is in contact with the organic photoelectric conversion film 52, and in a right half region thereof, the lower electrode 53a is not in contact with the organic photoelectric conversion film 52 due to the interlayer film 81.

On the other hand, in a phase difference pixel $2P_B$, in a right half region thereof, the lower electrode 53a is in contact with the organic photoelectric conversion film 52, and in a left half region thereof, the lower electrode 53a is not in contact with the organic photoelectric conversion film 52 due to the interlayer film 81.

Thus, between the phase difference pixel $2P_A$ and the phase difference pixel $2P_B$, contact regions of the lower electrode 53a and the organic photoelectric conversion film 52 in the pixels are different.

In each of the plane views, which are illustrated in a lower part of the sectional structure view and respectively illustrate photoelectric conversion regions of the phase difference pixel $2P_A$ and the phase difference pixel $2P_B$, a region at which the interlayer film 81 is formed is illustrated as an opening 82.

In such a pixel structure, it is possible to obtain an effect which is similar to that obtained by forming a light shielding film at the opening 82. Thus, in the phase difference pixel $2P_A$ and the phase difference pixel $2P_B$, G-signals for focus detection, which have asymmetric sensitivity to a light incident angle, can be generated.

Figure 4:
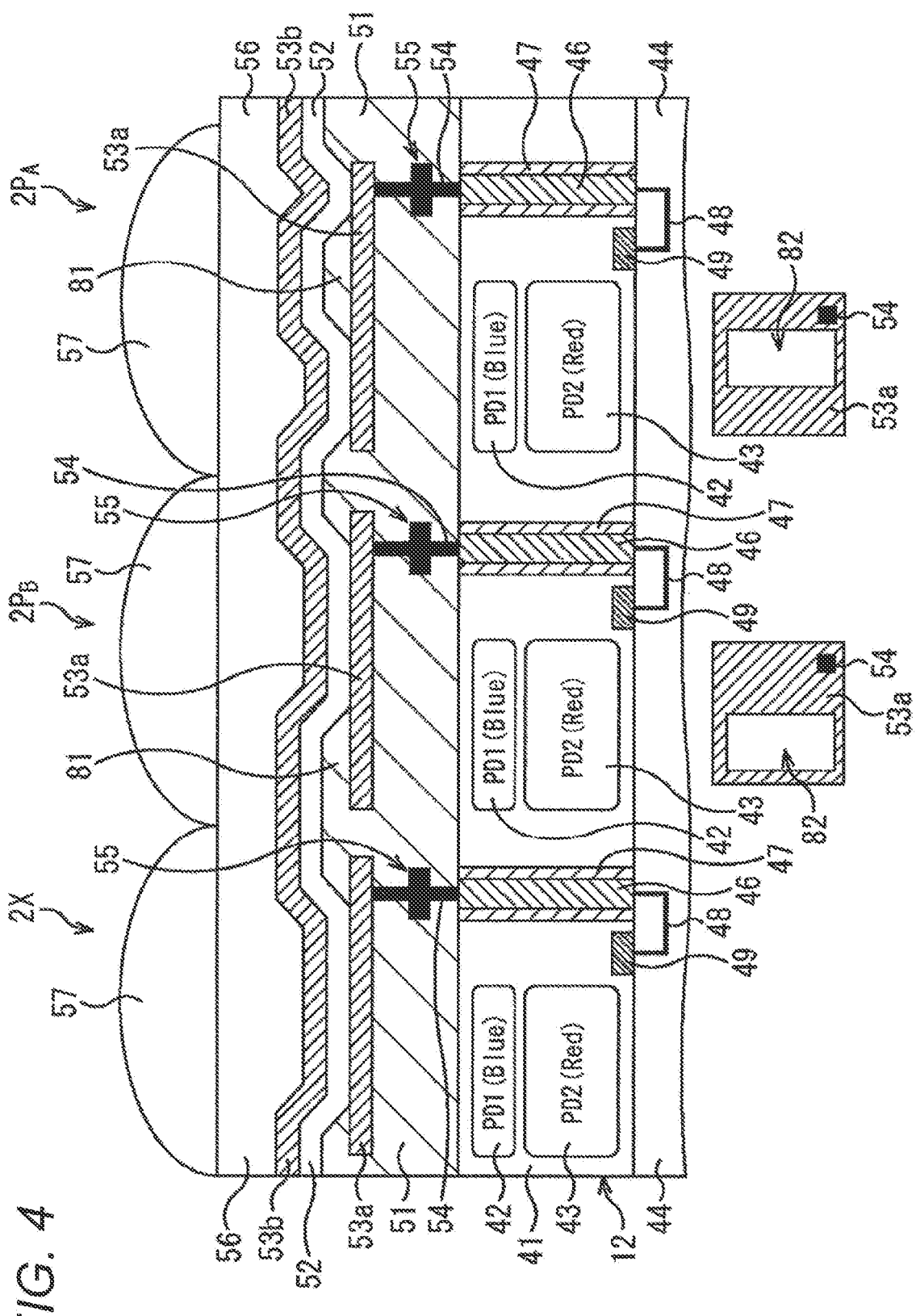
FIG. 4 is a sectional configuration view illustrating a phase difference pixel of a third embodiment.

In addition, in the phase difference pixel 2P of the third embodiment as illustrated in FIG. 4, it is not necessary to form a light shielding film at an upper surface of the organic photoelectric conversion film 52.

Thus, in a solid-state imaging element 1 of a longitudinal-direction spectral type, a phase difference pixel can be realized without increasing the number of processes and/or without increasing the number of steps during a manufacturing process.

5. Phase Difference Pixel of a Fourth Embodiment

Next, a phase difference pixel 2P of the fourth embodiment will be described with reference to FIG. 5.

Figure 5:
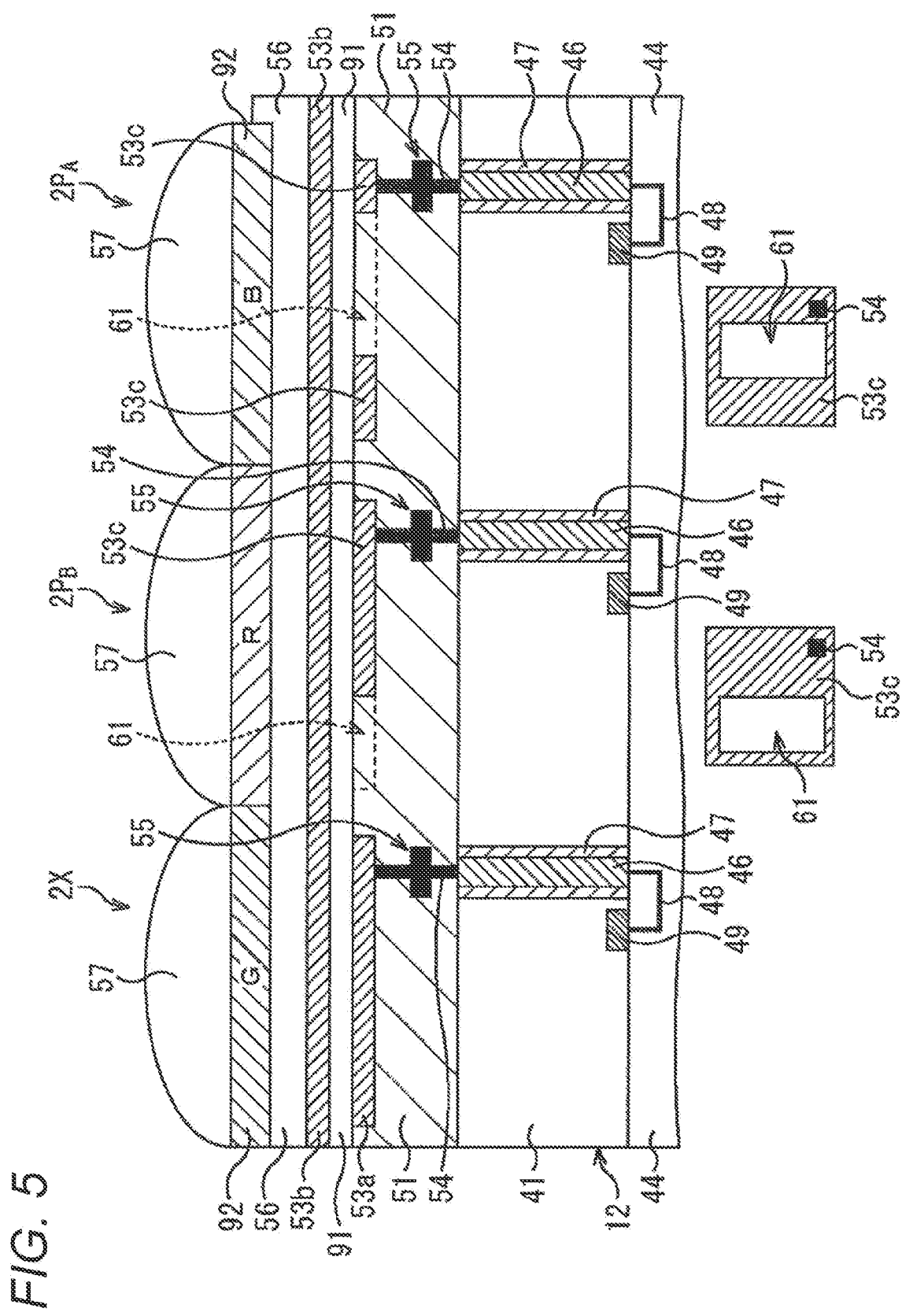
FIG. 5 is a sectional configuration view illustrating a phase difference pixel of a fourth embodiment.

The phase difference pixel 2P of the fourth embodiment illustrated in FIG. 5 is a modified example of the first embodiment illustrated in FIG. 2.

That is, the fourth embodiment is similar to the first embodiment in that regions of lower electrodes 53c are different between a phase difference pixel $2P_A$ and a phase difference pixel $2P_B$ to generate focus detection signals having asymmetric sensitivity to a light incident angle.

For example, while each of the pixels 2 receives all of the red (R), green (G), and blue (B) wavelength light in the first embodiment, each pixel 2 receives the red (R), green (G), or blue (B) wavelength light in the fourth embodiment.

Specifically, the organic photoelectric conversion film 52, which photoelectrically converts the green wavelength light in the first embodiment in FIG. 2, is replaced with an organic photoelectric conversion film 91 which photoelectrically converts all of the red (R), green (G), and blue (B) wavelength light as illustrated in the fourth embodiment in FIG. 5. Also, in a semiconductor substrate 12, a photodiode PD1 configured to receive blue light and a photodiode PD2 configured to receive red light are not provided.

On the other hand, in the fourth embodiment in FIG. 5, between a high refractive index layer 56 and an on-chip lens 57, a color filter 92 to pass the red (R), green (G), or blue (B) wavelength light is provided for each pixel.

Thus, only the red (R), green (G), or blue (B) wavelength light which has passed through the color filter 92 reaches the organic photoelectric conversion film 91, whereby each of the pixels 2 receives the red (R), green (G), or blue (B) wavelength light.

In the example in FIG. 5, a normal pixel 2X on a left side receives the green wavelength light. The phase difference pixel $2P_B$ in the middle receives the red wavelength light. The phase difference pixel $2P_A$ on a right side receives the blue wavelength light. However, the fourth embodiment is not limited to this example. For example, the phase difference pixel $2P_A$ and the phase difference pixel $2P_B$ receive the light of the same wavelength (color).

Also in the phase difference pixel 2P of the fourth embodiment as illustrated in FIG. 5, it is not necessary to form a light shielding film at an upper surface of the organic photoelectric conversion film 91. Thus, in a solid-state imaging element 1 of a longitudinal-direction spectral type, a phase difference pixel can be realized without increasing the number of processes and/or increasing the number of steps during a manufacturing process.

Note that the example in FIG. 5 is an example of a solid-state imaging element of a rear surface irradiation type. However, the pixel structure of the fourth embodiment can also be applied to a solid-state imaging element of a surface irradiation type.

6. Phase Difference Pixel of a Fifth Embodiment

Next, a phase difference pixel 2P of the fifth embodiment will be described with reference to FIG. 6.

Figure 6:
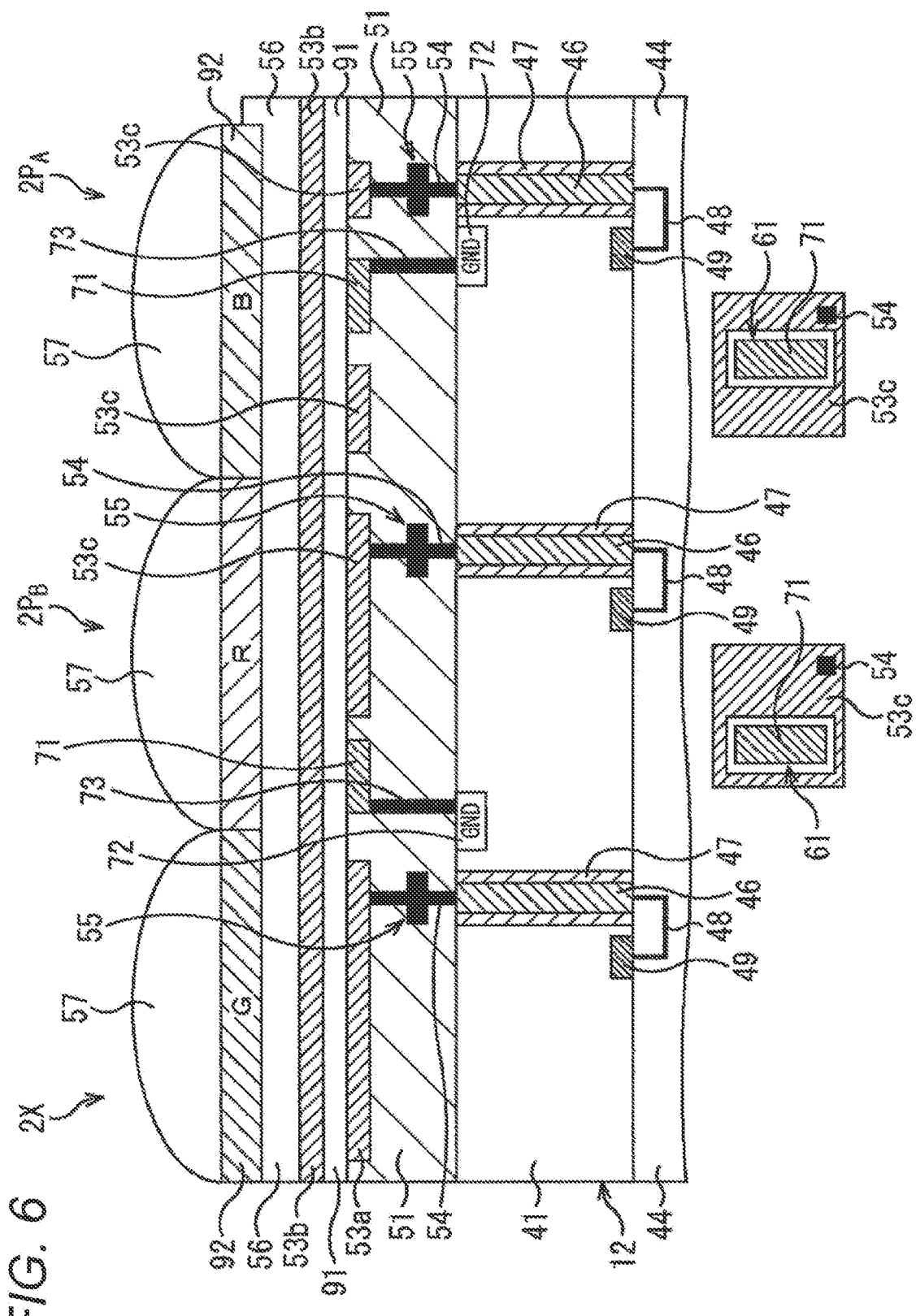
FIG. 6 is a sectional configuration view illustrating a phase difference pixel of a fifth embodiment.

The phase difference pixel 2P of the fifth embodiment illustrated in FIG. 6 is a modified example of the second embodiment illustrated in FIG. 3.

That is, the fifth embodiment is similar to the second embodiment in that formed regions of lower electrodes 53c are different between a phase difference pixel $2P_A$ and a phase difference pixel $2P_B$, and further that a lower electrode 71 is provided to discharge an unnecessary signal, through metal wiring 73, to a semiconductor region 72 at GND potential.

In the fifth embodiment, similar to the fourth embodiment illustrated in FIG. 5, each pixel 2 receives red (R), green (G), or blue (B) wavelength light.

That is, the organic photoelectric conversion film 52, which photoelectrically converts the green wavelength light, in the second embodiment is replaced with an organic photoelectric conversion film 91, which photoelectrically converts all of the red (R), green (G), and blue (B) wavelength light, in the fifth embodiment. Also, in a semiconductor substrate 12, a photodiode PD1 configured to receive blue light and a photodiode PD2 configured to receive red light are not provided.

Also, in the fifth embodiment, between a high refractive index layer 56 and an on-chip lens 57, a color filter 92 to pass the red (R), green (G), or blue (B) wavelength light is provided for each pixel.

Thus, only the red (R), green (G), or blue (B) wavelength light which has passed through the color filter 92 reaches the organic photoelectric conversion film 91, whereby each of the pixels 2 receives the red (R), green (G), or blue (B) wavelength light.

In the example in FIG. 6, a normal pixel 2X on a left side receives the green wavelength light. The phase difference pixel $2P_B$ in the middle receives the red wavelength light. The phase difference pixel $2P_A$ on a right side receives the blue wavelength light. However, the fifth embodiment is not limited to this example. For example, the phase difference pixel $2P_A$ and the phase difference pixel $2P_B$ receive the light of the same wavelength (color).

Also in the phase difference pixel 2P of the fifth embodiment as illustrated in FIG. 6, it is not necessary to form a light shielding film at an upper surface of the organic photoelectric conversion film 91. Thus, in a solid-state imaging element 1 of a longitudinal-direction spectral type, a phase difference pixel can be realized without increasing the number of processes and/or the number of steps in a manufacturing process.

Note that the example in FIG. 6 is an example of a solid-state imaging element of a rear surface irradiation type. However, the pixel structure of the fifth embodiment can also be applied to a solid-state imaging element of a surface irradiation type.

7. Phase Difference Pixel of a Sixth Embodiment

Next, a phase difference pixel 2P of the sixth embodiment will be described with reference to FIG. 7.

Figure 7:
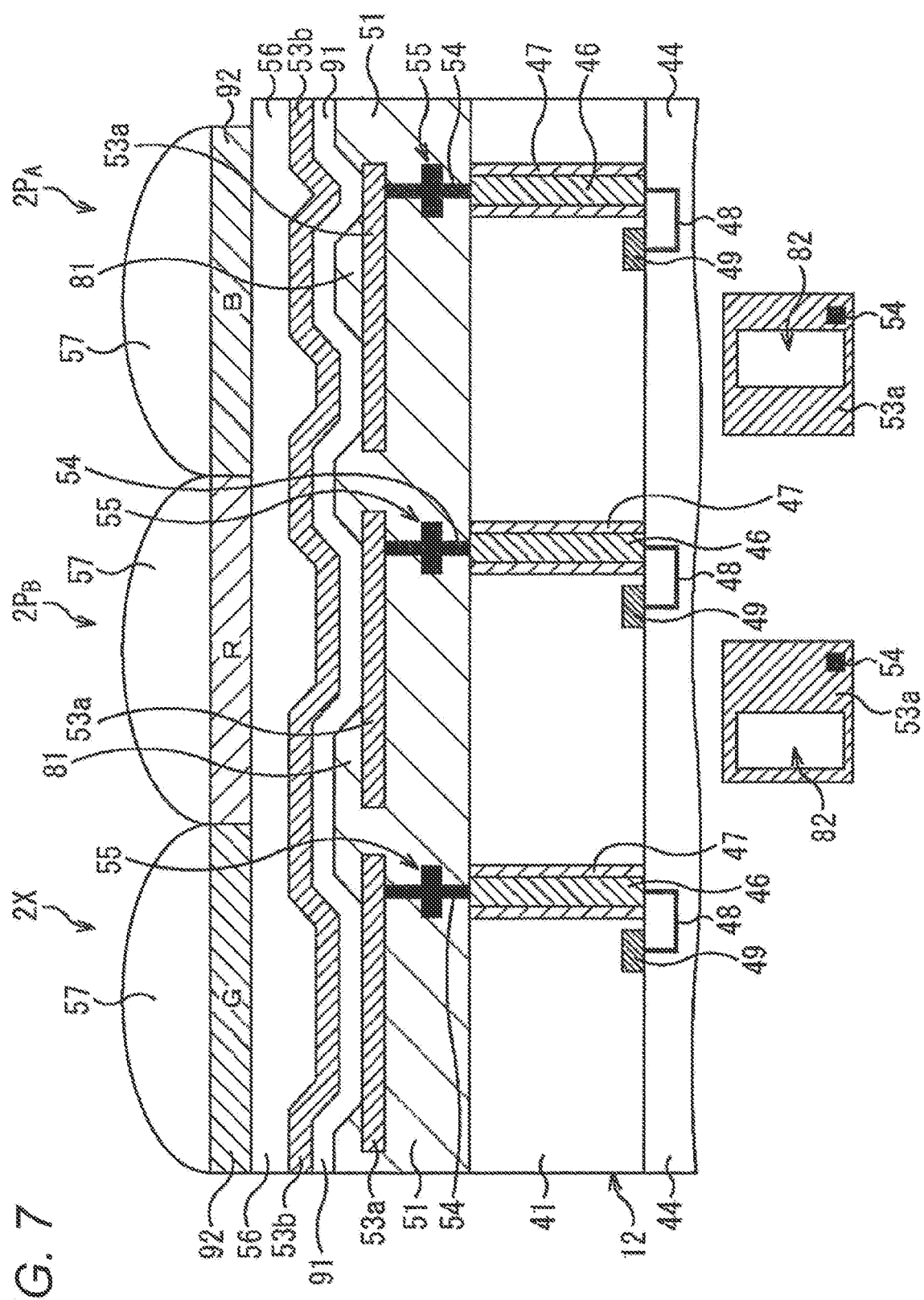
FIG. 7 is a sectional configuration view illustrating a phase difference pixel of a sixth embodiment.

The phase difference pixel 2P of the sixth embodiment illustrated in FIG. 7 is a modified example of the third embodiment illustrated in FIG. 4.

That is, the sixth embodiment is similar to the third embodiment in that in a phase difference pixel $2P_A$ and a phase difference pixel $2P_B$, an interlayer film 81 is provided between an organic photoelectric conversion film 52 and a lower electrode 53a to generate one or more focus detection signals having asymmetric sensitivity to a light incident angle.

On the other hand, in the sixth embodiment, similarly to the fourth embodiment illustrated in FIG. 5, each pixel 2 receives red (R), green (G), or blue (B) wavelength light.

That is, the organic photoelectric conversion film 52, which photoelectrically converts the green wavelength light in the third embodiment is replaced with an organic photoelectric conversion film 91, which photoelectrically converts all of the red (R), green (G), and blue (B) wavelength light, in the sixth embodiment. Also, in a semiconductor substrate 12, a photodiode PD1 configured to receive blue light and a photodiode PD2 configured to receive red light are not provided.

Also, in the sixth embodiment, between a high refractive index layer 56 and an on-chip lens 57, a color filter 92 to pass the red (R), green (G), or blue (B) wavelength light is provided for each pixel.

Thus, only the red (R), green (G), or blue (B) wavelength light which has passed through the color filter 92 reaches the organic photoelectric conversion film 91, whereby each of the pixels 2 receives the red (R), green (G), or blue (B) wavelength light.

In the example in FIG. 7, a normal pixel 2X on a left side receives the green wavelength light. The phase difference pixel $2P_B$ in the middle receives the red wavelength light. The phase difference pixel $2P_A$ on a right side receives the blue wavelength light. However, the sixth embodiment is not limited to this example. For example, the phase difference pixel $2P_A$ and the phase difference pixel $2P_B$ may receive the light of the same wavelength (color).

Also in the phase difference pixel 2P of the sixth embodiment illustrated in FIG. 7, it is not necessary to form a light shielding film at an upper surface of the organic photoelectric conversion film 91. Thus, in a solid-state imaging element 1 of a longitudinal-direction spectral type, a phase difference pixel can be realized without increasing the number of processes and/or increasing the number of steps in a manufacturing process.

Note that the example in FIG. 7 is an example of a solid-state imaging element of a rear surface irradiation type. However, the pixel structure of the sixth embodiment can also be applied to a solid-state imaging element of a surface irradiation type.

Conclusion of the First to Sixth Embodiments

In the first to sixth embodiments, a photoelectric conversion region of the phase difference pixel 2P having an organic photoelectric conversion film 52 is modified from that of the normal pixel 2X, such that focus detection signals having asymmetric sensitivity to a light incident angle may be generated.

In a solid-state imaging element of a longitudinal-direction spectral type in which green light is photoelectrically converted in an organic photoelectric conversion film 52 at an upper side of a semiconductor substrate 12 and blue and red light is photoelectrically converted in photodiodes PD1 and PD2 in the semiconductor substrate 12, when a light shielding film is formed at an upper part of the organic photoelectric conversion film 52, a process to form the light shielding film is newly added. Also, for a process of forming a color filter, an on-chip lens, or the like, it is necessary to remove a step in the light shielding film.

In the first to sixth embodiments, a photoelectric conversion region of a phase difference pixel 2P that includes an organic photoelectric conversion film 52 is modified from that in the normal pixel 2X, whereby a phase difference pixel is realized without providing a light shielding film on an upper part of the organic photoelectric conversion film 52.

Thus, in a solid-state imaging element 1 of a longitudinal-direction spectral type, a phase difference pixel can be realized without increasing the number of processes and/or the number of steps in a manufacturing process.

8. Phase Difference Pixel of a Seventh Embodiment

Next, the phase difference pixel 2P of the seventh embodiment will be described with reference to FIG. 8.

Also in the description of the seventh embodiment illustrated in FIG. 8, a part different from the first embodiment will be described.

Figure 8:
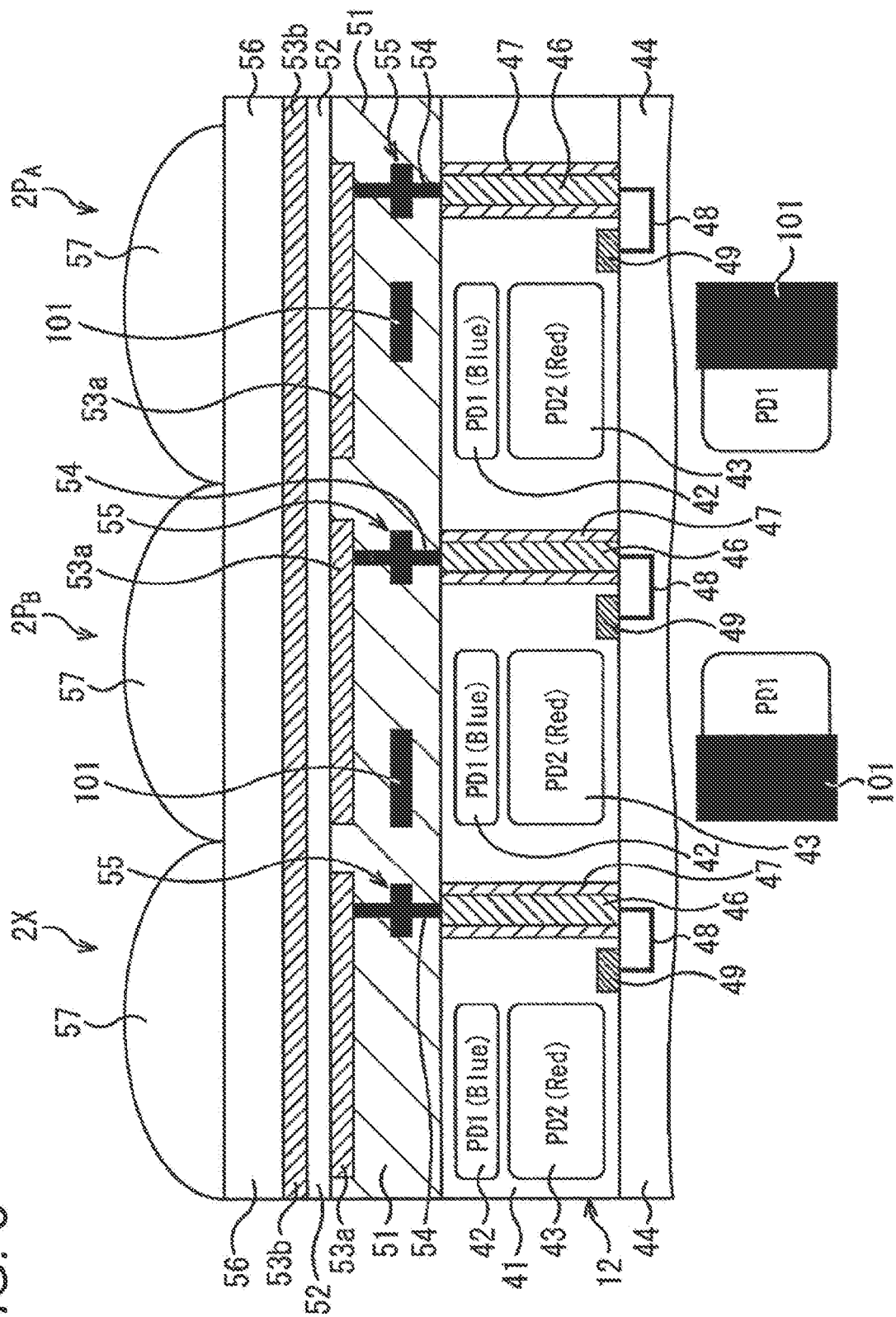
FIG. 8 is a sectional configuration view illustrating a phase difference pixel of a seventh embodiment.

In the seventh embodiment as illustrated in FIG. 8, an organic photoelectric conversion film 52 is not used as an organic photoelectric conversion layer to generate a focus detection signal. Rather, photodiodes PD1 and PD2 in a semiconductor substrate 12 are used as inorganic photoelectric conversion layers to generate a focus detection signal.

Specifically, in a phase difference pixel 2P of the seventh embodiment, similar to a normal pixel 2X, a lower electrode 53a having no opening is formed on a lower surface of the organic photoelectric conversion film 52. Thus, G-signals generated in the normal pixel 2X and the phase difference pixel 2P are not different from each other.

On the other hand, at each of a phase difference pixel $2P_A$ and a phase difference pixel $2P_B$, a light shielding film 101 that shields a portion of light receiving regions of the photodiodes PD1 and PD2 is newly provided; such light shielding film 101 may be provided in the same layer with a light shielding film 55 between pixels, in a transparent insulating film 51.

In FIG. 8, in a lower part of the sectional structure view of the phase difference pixel $2P_A$ and the phase difference pixel $2P_B$, plane views, each of which illustrates an upper surface of the photodiode PD1, are illustrated.

In the phase difference pixel $2P_A$, the light shielding film 101 is arranged to shield a right half of the photodiode PD1, and in the phase difference pixel $2P_B$, the light shielding film 101 is arranged to shield a left half of the photodiode PD1. Thus, in the phase difference pixel $2P_A$ and the phase difference pixel $2P_B$, a B-signal and an R-signal for focus detection, which have asymmetric sensitivity to a light incident angle, can be generated. Note that either one of the B-signal and the R-signal may be used as the focus detection signal, or both the B-signal and the R-signal may be used as the focus detection signals.

According to the phase difference pixel 2P of the seventh embodiment, it is not necessary to form a light shielding film on an upper surface of the organic photoelectric conversion film 52; thus, it is possible to form the light shielding film 101 in the same process of forming the light shielding film 55 between pixels. Thus, in a solid-state imaging element 1 of a longitudinal-direction spectral type, a phase difference pixel can be realized without increasing the number of processes and/or the number of steps in a manufacturing process.

9. Phase Difference Pixel of an Eighth Embodiment

Next, a phase difference pixel 2P of the eighth embodiment will be described with reference to FIG. 9.

In the description of the eighth embodiment illustrated in FIG. 9, a part different from the seventh embodiment illustrated in FIG. 8 will be described.

Figure 9:
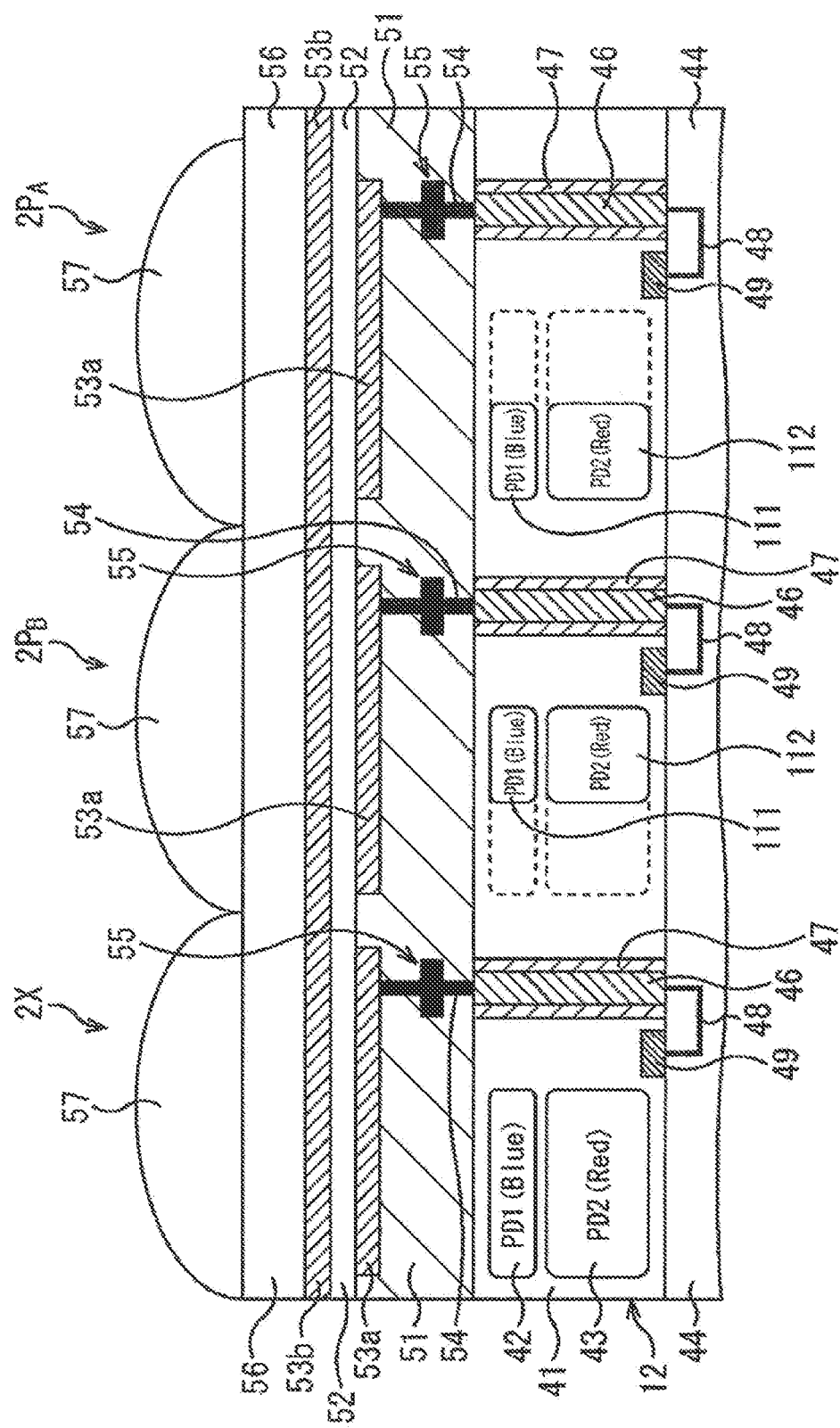
FIG. 9 is a sectional configuration view illustrating a phase difference pixel of an eighth embodiment.

The eighth embodiment illustrated in FIG. 9 is similar to the seventh embodiment illustrated in FIG. 8 in that an organic photoelectric conversion film 52 is not used as an organic photoelectric conversion layer to generate a focus detection signal; rather photodiodes PD1 and PD2 in a semiconductor substrate 12 are used as inorganic photoelectric conversion layers to generate a focus detection signal.

On the other hand, while in the seventh embodiment, the light shielding film 101 is provided at the upper surface of the photodiode PD1, the light shielding film 101 is not provided in the eighth embodiment. Instead, second conductivity type semiconductor regions 111 and 112, which are charge accumulation regions of the photodiodes PD1 and PD2, are formed to be a half of semiconductor regions 42 and 43 of a normal pixel 2X.

Specifically, compared to the normal pixel 2X, the second conductivity type semiconductor regions 111 and 112 are formed only to a left half region in a phase difference pixel $2P_A$. Also, compared to the normal pixel 2X, the second conductivity type semiconductor regions 111 and 112 are formed only to a right half region in a phase difference pixel $2P_B$.

Since the semiconductor regions 111 and 112 in the semiconductor substrate 12 is formed by injecting a second conductivity type (n-type) ion such as As (arsenic), it is possible to form the semiconductor regions 42 and 43 and the semiconductor regions 111 and 112 simultaneously by changing ion injection regions from the semiconductor regions 42 and 43 of the normal pixel 2X.

Thus, in the phase difference pixel $2P_A$ and the phase difference pixel $2P_B$, a B-signal and an R-signal for focus detection, which have asymmetric sensitivity to a light incident angle, can be generated. Note that either one of the B-signal and the R-signal may be used as the focus detection signal, or both the B-signal and the R-signal may be used as the focus detection signals.

Conclusion of the Seventh and Eighth Embodiments

In the seventh and eighth embodiments, an organic photoelectric conversion film 52 is not used as an organic photoelectric conversion layer to generate a focus detection signal. The photodiodes PD1 and PD2 in the semiconductor substrate 12 are used as inorganic photoelectric conversion layers to generate a focus detection signal.

In a solid-state imaging element of a longitudinal-direction spectral type, when a light shielding film is formed at an upper part of an organic photoelectric conversion film 52, a process of forming the light shielding film is newly added. Also, for a process of forming a color filter, an on-chip lens, or the like, it is desirable to remove a step in the light shielding film.

On the other hand, in the seventh embodiment, it is not necessary to form a light shielding film on an upper side of the organic photoelectric conversion film 52, and thus, it is possible to form the light shielding film 101 in the same process of forming the light shielding film 55 between pixels. In the eighth embodiment, by changing ion injection regions, it is possible to form the semiconductor regions 42 and 43 and the semiconductor regions 111 and 112 in the same ion injection process.

Thus, in a solid-state imaging element 1 of a longitudinal-direction spectral type, a phase difference pixel can be realized without increasing the number of processes and/or the number of steps in a manufacturing process.

10. Phase Difference Pixel of a Ninth Embodiment

Next, a phase difference pixel 2P of the ninth embodiment will be described with reference to FIG. 10.

Figure 10:
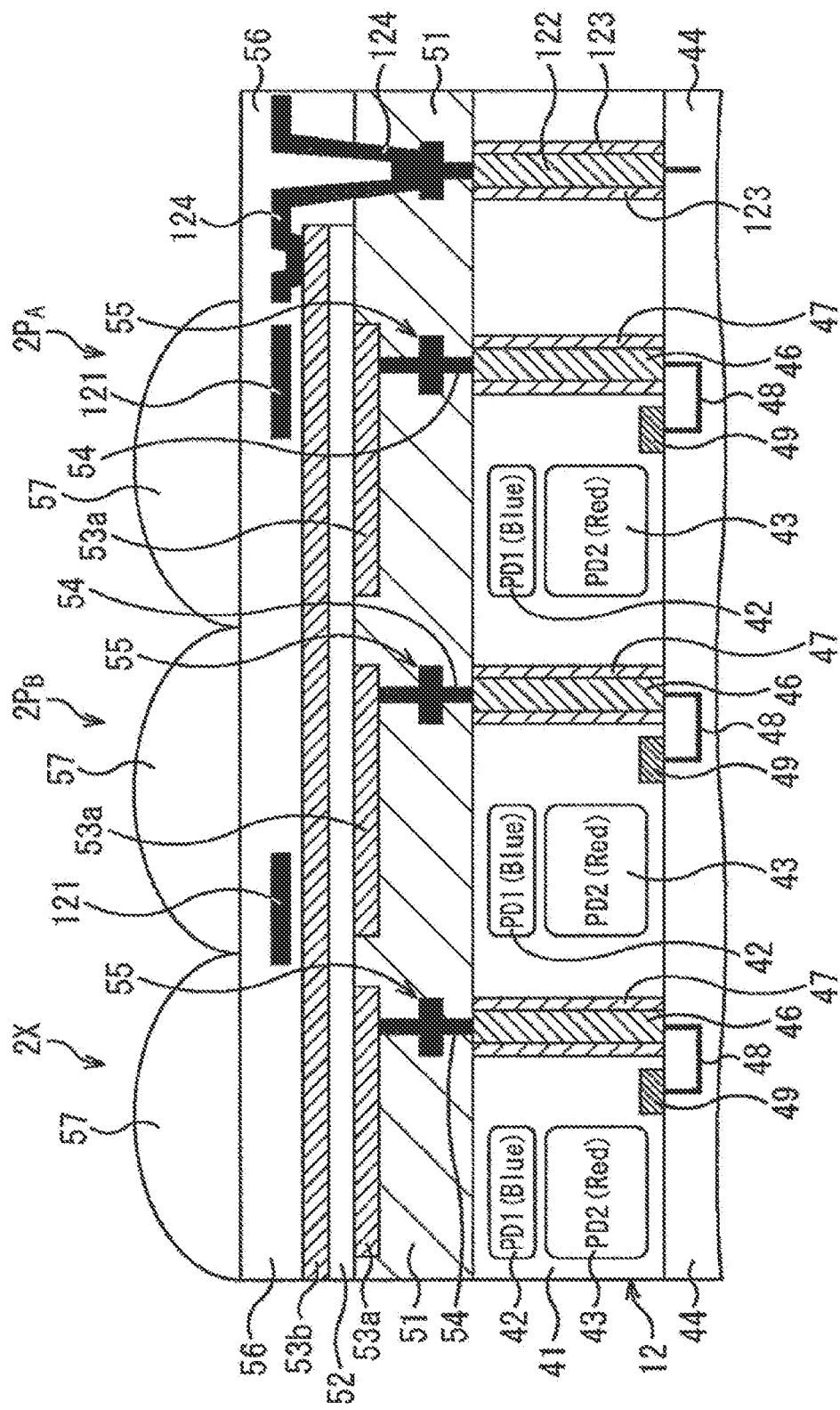
FIG. 10 is a sectional configuration view illustrating a phase difference pixel of a ninth embodiment.

In the description of the ninth embodiment as illustrated in FIG. 10, a part different from the seventh embodiment illustrated in FIG. 8 will be described.

In the seventh embodiment illustrated in FIG. 8, the light shielding films 101 are provided in the transparent insulating film 51 of the phase difference pixel $2P_A$ and the phase difference pixel $2P_B$. Alternatively, or in addition, in the ninth embodiment, a light shielding film 121 that changes the sensitivity to a light incident angle is provided in a high refractive index layer 56 under an on-chip lens 57. Specifically, in a phase difference pixel $2P_A$, the light shielding film 121 is formed to shield a right side of an organic photoelectric conversion film 52 and photodiodes PD1 and PD2, and in a phase difference pixel $2P_B$, the light shielding film 121 is formed to shield a left side of the organic photoelectric conversion film 52 and photodiodes PD1 and PD2.

Thus, in the phase difference pixel $2P_A$ and the phase difference pixel $2P_B$, a G-signal, a B-signal and an R-signal for focus detection having different sensitivities to a light incident angle, may be generated. Note that one or two of the G-signal, the B-signal, and the R-signal may be used as the focus detection signals, or all of the G-signal, the B-signal, and the R-signal may be used as focus detection signals.

Also, in FIG. 10, on the right side of a phase difference pixel $2P_A$, a power source supplying unit that supplies a predetermined voltage to an upper electrode 53b is illustrated.

Specifically, a conductive plug 122 to supply power from the power source to the upper electrode 53b of a rear surface side, from a multi-layer wiring layer 44 on a side of a substrate surface (lower side in the drawing) is formed and penetrates a semiconductor substrate 12. Also, to an outer periphery of the conductive plug 122, an insulating film 123 is formed to control a short-circuit with a semiconductor region 41.

Also, at the rear surface side of the semiconductor substrate 12, the conductive plug 122 and the upper electrode 53b are connected to each other by connection wiring 124. The connection wiring 124 may be formed of a material such as, but not limited to, tungsten (W), aluminum (Al), or copper (Cu).

The light shielding film 121 formed at the phase difference pixel 2P can be formed in the same process of forming the connection wiring 124 which supplies a predetermined voltage to the upper electrode 53b.

Note that in the example in FIG. 10, the light shielding film 121 and the upper electrode 53b are not connected to each other. However, in some embodiments, the light shielding film 121 and the upper electrode 53b are connected in order to increase their electrical stability.

11. Phase Difference Pixel of a Tenth Embodiment

Next, a phase difference pixel 2P of the tenth embodiment will be described with reference to FIG. 11.

Figure 11:
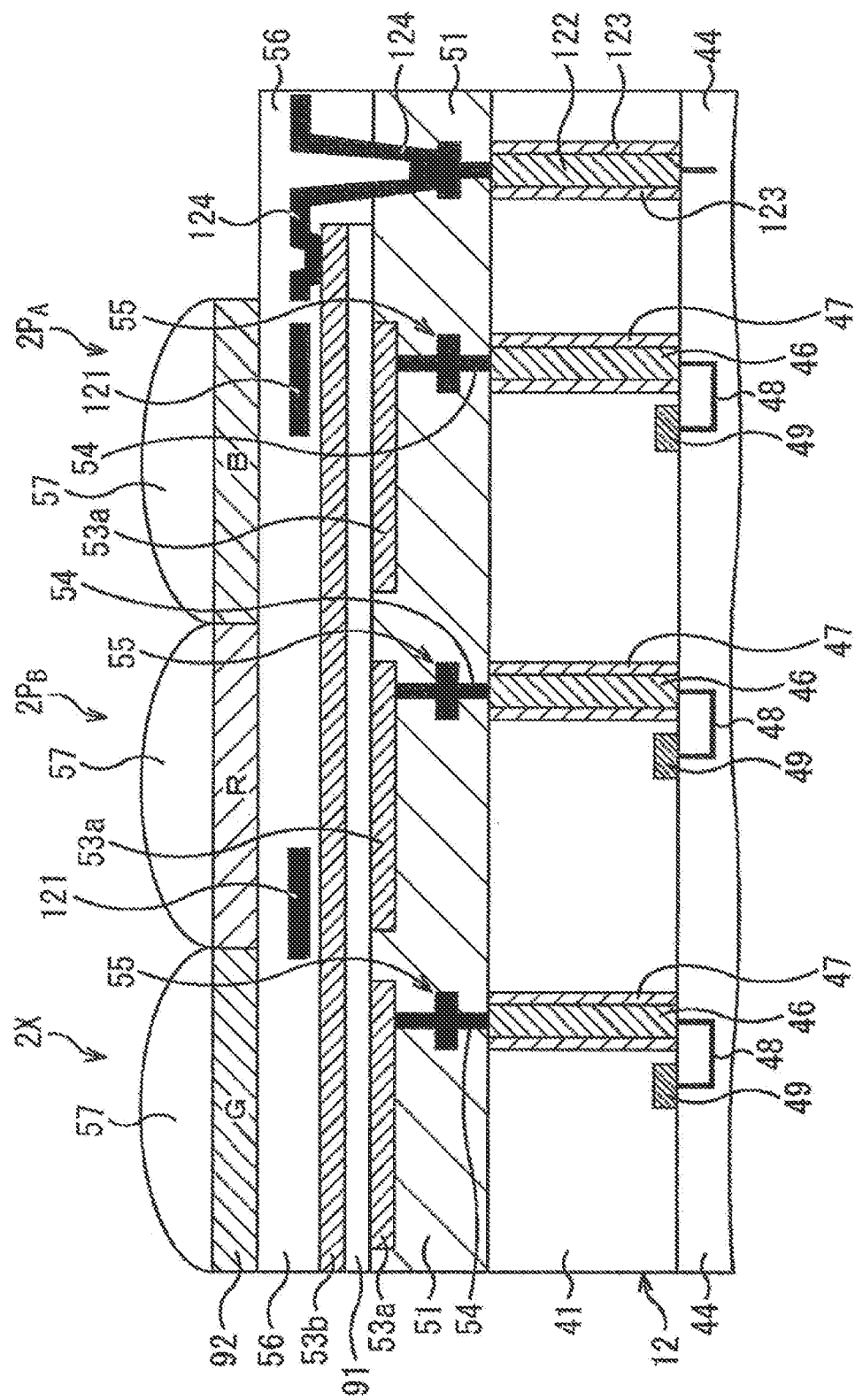
FIG. 11 is a sectional configuration view illustrating a phase difference pixel of a tenth embodiment.

In the description of the tenth embodiment as illustrated in FIG. 11, a part different from the ninth embodiment illustrated in FIG. 10 will be described.

As illustrated in FIG. 10, each of the pixels 2 receives all of the red (R), green (G), and blue (B) wavelength light; in the tenth embodiment as illustrated in FIG. 11, a color filter 92 is arranged between a high refractive index layer 56 and an on-chip lens 57, whereby each pixel 2 receives the red (R), green (G), or blue (B) wavelength light.

Thus, the color of light photoelectrically converted by an organic photoelectric conversion film 91 of each of the pixels 2 differs according to the color of the provided color filter 92.

Also, in the tenth embodiment, a photodiode PD1 configured to receive blue light and a photodiode PD2 configured to receive red light are not provided in the semiconductor substrate 12.

Similar to the ninth embodiment in FIG. 10, light shielding films 121 are arranged in the high refractive index layer 56 in such a manner that the phase difference pixel $2P_A$ and the phase difference pixel $2P_B$ have a different sensitivity to a light incident angle.

Thus, in each of the phase difference pixel $2P_A$ and the phase difference pixel $2P_B$, a G-signal, a B-signal or an R-signal for focus detection can be generated. The G-signal, a B-signal and an R-signal have different sensitivity to a light incident angle.

Also in FIG. 11, the light shielding film 121 and an upper electrode 53b are not connected to each other. However, in some embodiments, the light shielding film 121 and the upper electrode 53b are connected to increase their electrical stability.

Also, in the example in FIG. 11, the phase difference pixel $2P_B$ receives the red wavelength light and the phase difference pixel $2P_A$ receives the blue wavelength light. However, in some embodiments, the phase difference pixel $2P_A$ and the phase difference pixel $2P_B$ may receive light of the same wavelength (color).

Note that the example in FIG. 11 is an example of a solid-state imaging element of a rear surface irradiation type. However, the pixel structure of the tenth embodiment can also be applied to a solid-state imaging element of a surface irradiation type.

Conclusion of the Ninth and Tenth Embodiments

In the ninth and tenth embodiments, a light shielding film 121 may be formed at an upper side of an organic photoelectric conversion film 52 in the same process of forming connection wiring 124 which supplies a predetermined voltage to an upper electrode 53b. Thus, in a solid-state imaging element 1 of a longitudinal-direction spectral type, a phase difference pixel can be realized without increasing the number of processes and/or increasing the number of steps in a manufacturing process.

12. Phase Difference Pixel of an Eleventh Embodiment

Next, a phase difference pixel 2P of the eleventh embodiment will be described with reference to FIG. 12.

In the description of the eleventh embodiment illustrated in FIG. 12, a part different from the seventh embodiment illustrated in FIG. 8 will be described.

Figure 12:
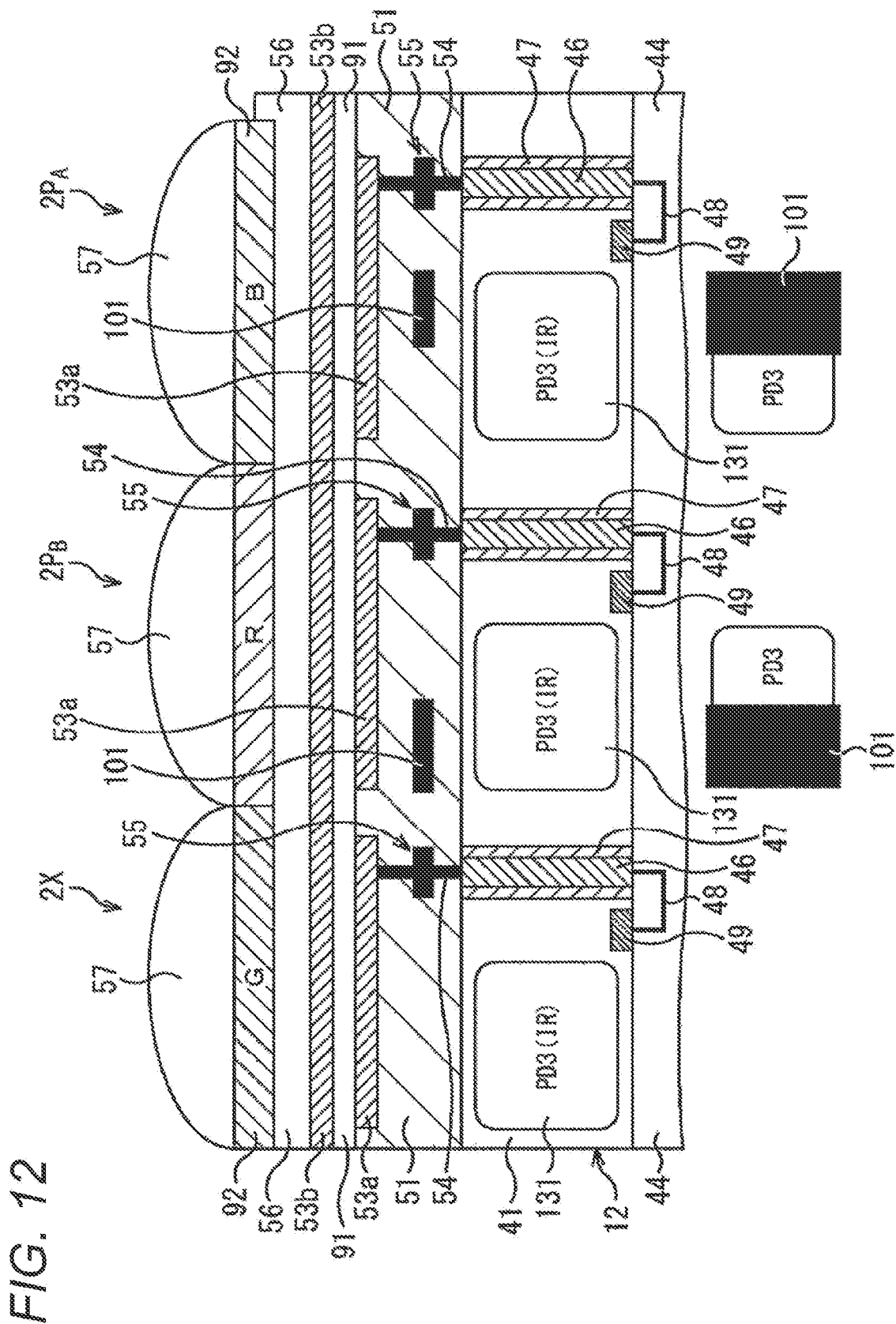
FIG. 12 is a sectional configuration view illustrating a phase difference pixel of an eleventh embodiment.

While in the seventh embodiment illustrated in FIG. 8, each of the pixels 2 receives all of the red (R), green (G), and blue (B) wavelength light, in the eleventh embodiment in FIG. 12, each pixel 2 receives the red (R), green (G), or blue (B) wavelength light.

That is, in the eleventh embodiment, in each of a normal pixel 2X, a phase difference pixel $2P_A$, and a phase difference pixel $2P_B$, an organic photoelectric conversion film 91, which photoelectrically converts all of the red (R), green (G), and blue (B) wavelength light, is sandwiched and formed between a lower electrode 53a and an upper electrode 53b.

Also, between a high refractive index layer 56 and an on-chip lens 57, a color filter 92 to pass the red (R), green (G), or blue (B) wavelength light is arranged for each pixel.

Thus, the color of light photoelectrically converted by an organic photoelectric conversion film 91 of each of the pixels 2 differs according to the color of the provided color filter 92.

Also, in the eleventh embodiment, a photodiode PD1 configured to receive blue light and a photodiode PD2 configured to receive red light are not provided in a first conductivity type semiconductor region 41 in a semiconductor substrate 12. Instead, by forming a second conductivity type semiconductor region 131, a photodiode PD3 is formed for each pixel. Since red (R), green (G), or blue (B) visible light is absorbed in the organic photoelectric conversion film 91, the photodiode PD3 functions as an inorganic photoelectric conversion unit which photoelectrically converts infrared light.

According to the configuration above, in the eleventh embodiment, in each of the normal pixel 2X, the phase difference pixel $2P_A$, and the phase difference pixel $2P_B$, the organic photoelectric conversion film 91 outputs a red (R), green (G), or blue (B) image generation signal. Thus, in the eleventh embodiment, even in the phase difference pixel $2P_A$ and the phase difference pixel $2P_B$, pixel signals which are similar to that of the normal pixel 2X may be output, while a phase difference pixel is generally treated as a defective pixel and correction processing is necessary. That is, the phase difference pixel $2P_A$ and the phase difference pixel $2P_B$ are not treated as the defective pixels.

In addition, as a signal for phase difference detection, an output signal of the photodiode PD3 which receives and photoelectrically converts the infrared light can be used.

Note that as described above, an image generation signal is obtained from the organic photoelectric conversion film 91, and thus, a light shielding film 101 may be formed on the photodiode PD3 of the normal pixel 2X to generate a phase difference. In this case, since phase difference information may be obtained from all of the pixels in the pixel array unit 3, a phase difference signal detected in the photodiode PD3 may be used not only for an autofocus control, but also, for example, for obtaining depth information for 3D image photographing, or the like.

13. Phase Difference Pixel of a Twelfth Embodiment

Figure 13:
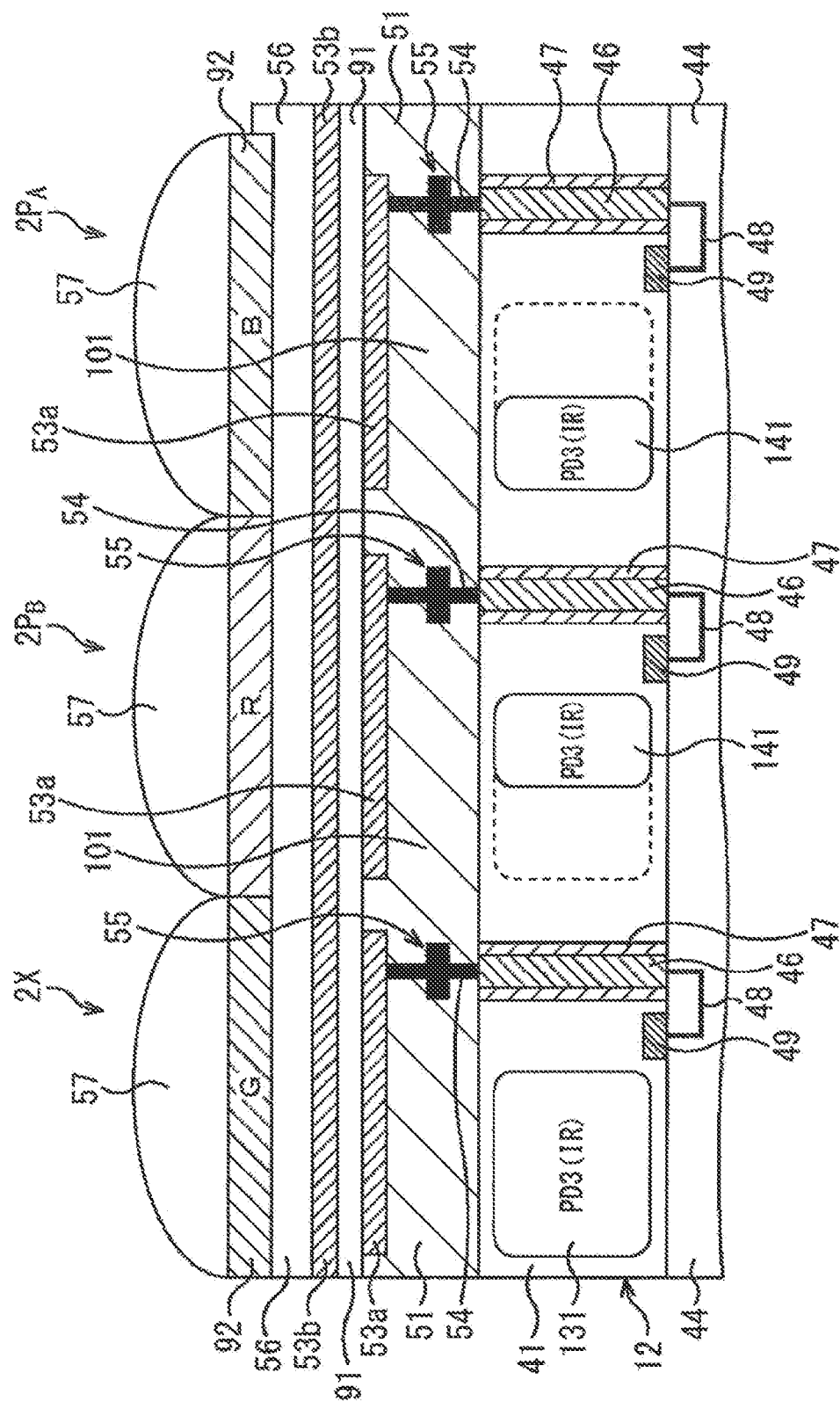
FIG. 13 is a sectional configuration view illustrating a phase difference pixel of a twelfth embodiment.

Next, a phase difference pixel 2P of the twelfth embodiment will be described with reference to FIG. 13.

In the description of the twelfth embodiment illustrated in FIG. 13, a part different from the eleventh embodiment illustrated in FIG. 12 will be described.

In the twelfth embodiment, similar to the eleventh embodiment illustrated in FIG. 12, each pixel 2 receives red (R), green (G), or blue (B) wavelength light. That is, by a color filter 92 and an organic photoelectric conversion film 91, each of a normal pixel 2X, a phase difference pixel $2P_A$, and a phase difference pixel $2P_B$ receives the red (R), green (G), or blue (B) wavelength light, and further outputs an image generation signal.

On the other hand, while in the eleventh embodiment as illustrated in FIG. 12, the light shielding film 101 is provided on the upper side of the photodiode PD3 of the phase difference pixel 2P, the light shielding film 101 is not provided in the twelfth embodiment. Instead, a second conductivity type semiconductor region 141, which is a charge accumulation region of the photodiode PD3, is formed to be a half of a semiconductor region 131 of the normal pixel 2X.

Specifically, compared to the normal pixel 2X, the second conductivity type semiconductor region 141 is formed only to a left half region in the phase difference pixel $2P_A$. Also, compared to the normal pixel 2X, the second conductivity type semiconductor region 141 is formed only to a right half region in the phase difference pixel $2P_B$.

Since the semiconductor regions 141 in the semiconductor substrate 12 is formed by injecting a second conductivity type (n-type) ion such as As (arsenic), it is possible to form the semiconductor regions 131 and 141 simultaneously, by changing an ion injection region from the semiconductor region 131 of the normal pixel 2X.

According to the configuration above, in the twelfth embodiment, in each of the normal pixel 2X, the phase difference pixel $2P_A$, and the phase difference pixel $2P_B$, the organic photoelectric conversion film 91 outputs a red (R), green (G), or blue (B) image generation signal. Thus, in the twelfth embodiment, even in the phase difference pixel $2P_A$ and the phase difference pixel $2P_B$, pixel signals which are similar to that of the normal pixel 2X can be output. While a phase difference pixel is generally treated as a defective pixel and correction processing is necessary, in at least some embodiments, the phase difference pixel $2P_A$ and the phase difference pixel $2P_B$ are not treated as the defective pixels.

Also, as a signal for phase difference detection, an output signal of the photodiode PD3 which receives and photoelectrically converts the infrared light can be used.

Note that as described above, an image generation signal is obtained from the organic photoelectric conversion film 91, and thus, a semiconductor region 141 can be formed instead of the semiconductor region 131, to detect phase difference, also in the photodiode PD3 of the normal pixel 2X. In this case, since phase difference information can be obtained from all of the pixels in the pixel array unit 3, a phase difference signal detected in the photodiode PD3 can be used not only for an autofocus control, but also, for example, for obtaining depth information for 3D image photographing, or the like.

Conclusion of the Eleventh and Twelfth Embodiments

Although a phase difference pixel is generally treated as a defective pixel and needs correction processing, according to the eleventh and twelfth embodiments, since all pixels 2 including a phase difference pixel 2P can output image generation signals, a phase difference pixel $2P_A$ and a phase difference pixel $2P_B$ are not treated as the defective pixels. Thus, correction processing on a phase difference pixel becomes unnecessary, and because the amount of defective pixels do not increase due to the additional phase difference pixels used for phase detection, the quality of an imaged image may increase.

Also, a phase difference signal detected in the photodiode PD3 may be used for an autofocus control, and/or for obtaining depth information for 3D image photographing or the like, for example.

14. Production Method of the First Embodiment

Next, a production method of the first embodiment illustrated in FIG. 2 will be described with reference to FIG. 14 to FIG. 21.

Note that in FIG. 14 to FIG. 21, a production method of producing a power source supplying unit for the upper electrode 53b, which unit is not illustrated in FIG. 2, will also be described.

Figure 14A:
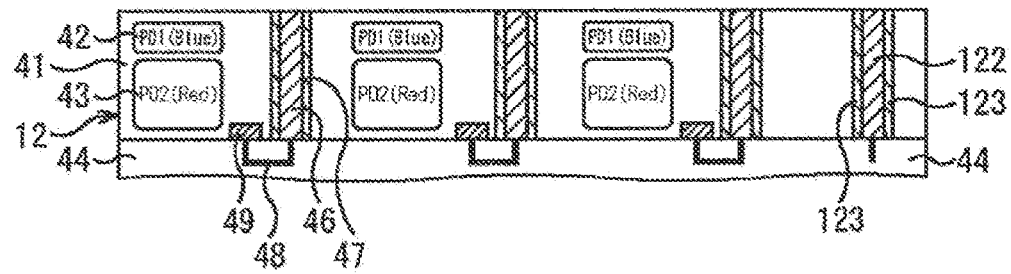
FIG. 14A-14D are illustrations for describing a production method of the first embodiment.

First, as illustrated in FIG. 14A, in a semiconductor region 41 in a semiconductor substrate 12, photodiodes PD1 and PD2, a conductive plug 46, an FD unit 49, and a conductive plug 122 and the like to supply a power source to the upper electrode 53b are formed.

Also, on a surface side (lower side in the drawing) of the semiconductor substrate 12, a plurality of pixel transistors, for example, to read charge accumulated in the photodiodes PD1 and PD2, and a multi-layer wiring layer 44 including a plurality of wiring layers and interlayer insulating films are formed.

Figure 14B:
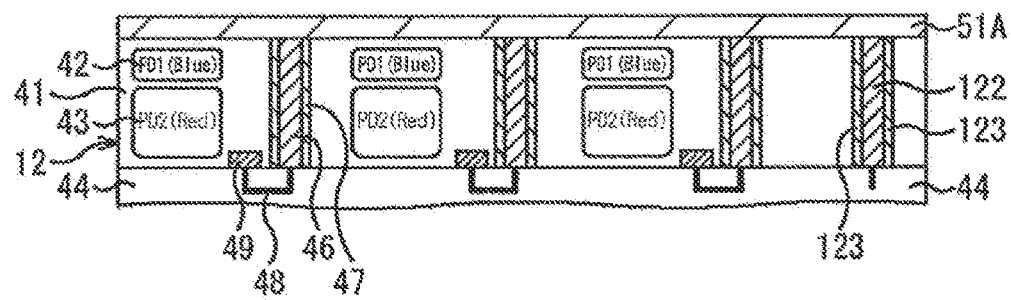

Then, as illustrated in FIG. 14B, at an interface of a rear surface side of the semiconductor substrate 12, a transparent insulating film 51A is formed having a predetermined thickness.

Figure 14C:
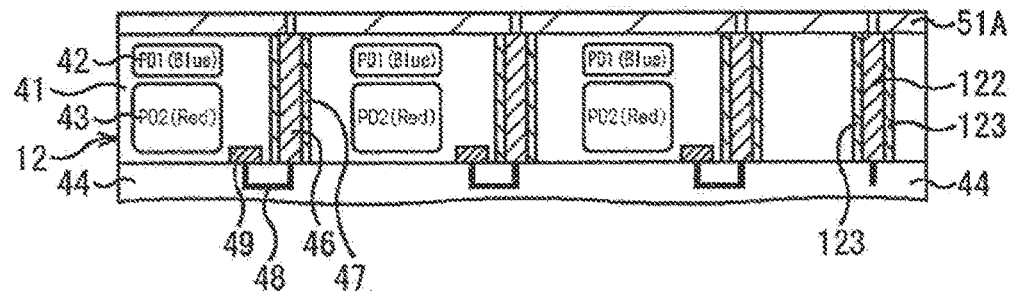

Next, as illustrated in FIG. 14C, a region, which is connected to the conductive plug 46, of transparent insulating film 51A formed at the interface of the rear surface side of the semiconductor substrate 12 is opened by lithography.

Figure 14D:
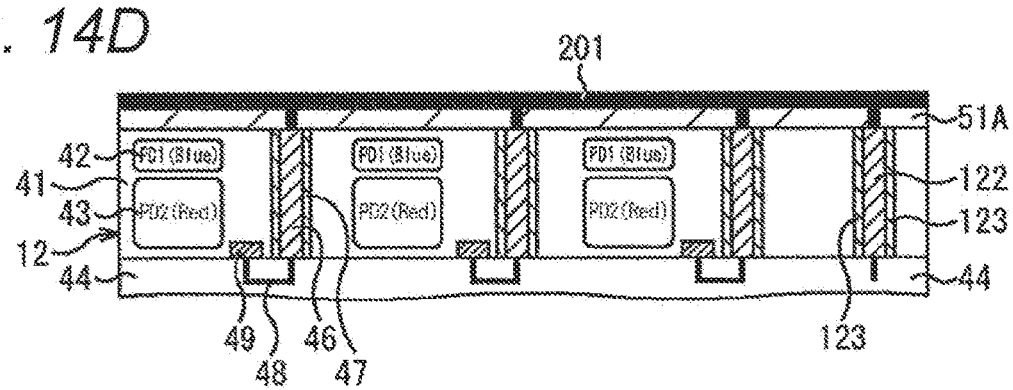

Then, as illustrated in FIG. 14D, a metal material 201 that includes tungsten (W), aluminum (Al), and/or copper (Cu) is formed on a whole upper side surface of the transparent insulating film 51A; the metal material 201 is additionally formed in the opened engraved part of the transparent insulating film 51A opened by a lithography process as illustrated in FIG. 14C.

Figure 15A:
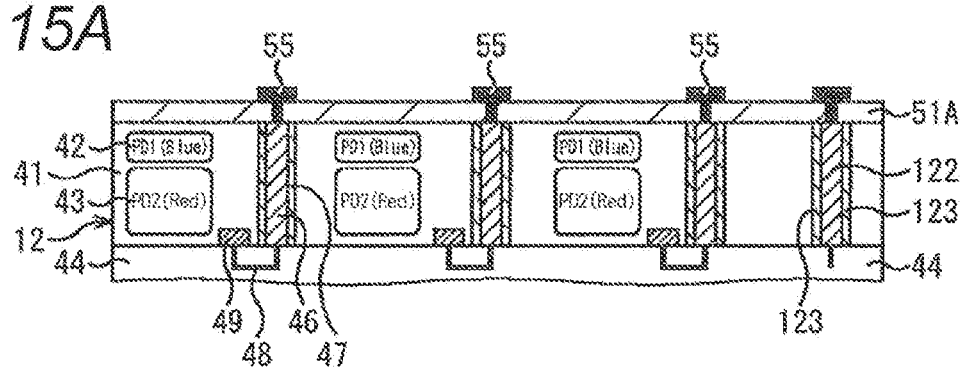
FIG. 15A-15D are illustrations for describing the production method of the first embodiment.

As illustrated in FIG. 15A, patterning is performed by lithography on the metal material 201 formed on the whole surface on the transparent insulating film 51A; such a lithography process leaves a region 55. Thus, a light shielding film 55 between pixels is formed.

Figure 15B:
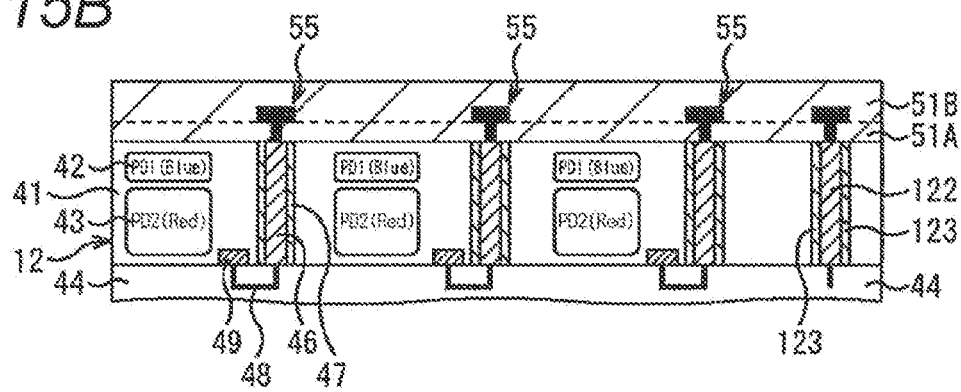
Figure 15C:
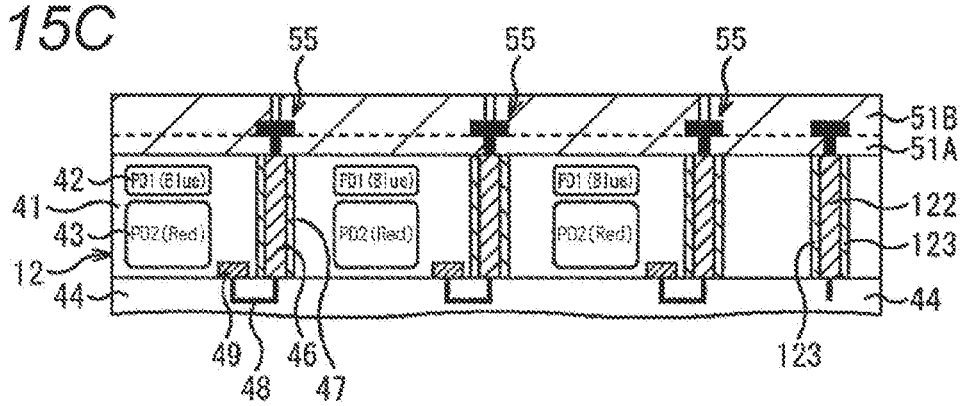

Then, as illustrated in FIG. 15B, on an upper side of the transparent insulating film 51A and the light shielding film 55 between pixels, a transparent insulating film 51B is laminated, and then, as illustrated in FIG. 15C, only a region which is connected to the conductive plug 46 of the laminated transparent insulating film 51B is opened by the lithography.

Figure 15D:
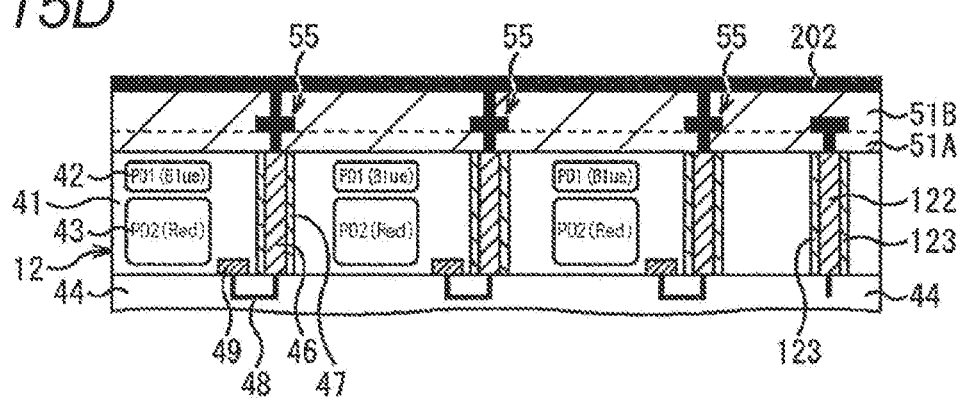
Figure 16A:
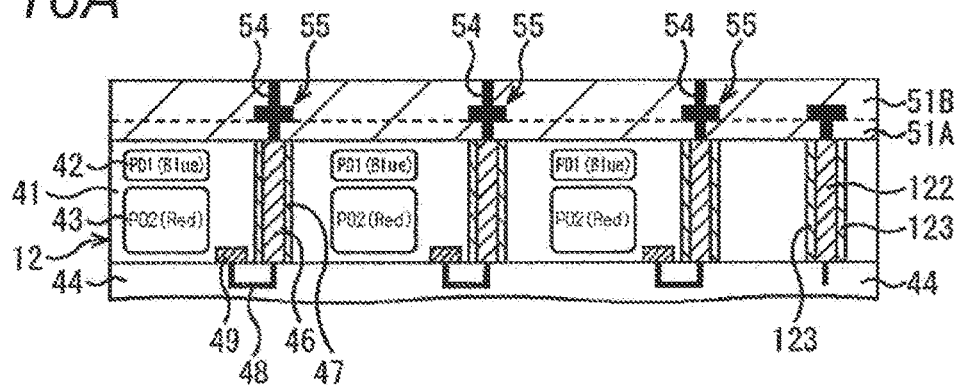
FIG. 16A-16D are illustrations for describing the production method of the first embodiment.

After a metal material 202 is formed on a whole upper side surface of the transparent insulating film 51B including the opened engraved part of the transparent insulating film 51B as illustrated in FIG. 15D, the metal material 202 on a surface layer is removed by chemical mechanical polishing (CMP). Thus, as illustrated in FIG. 16A, metal wiring 54 which penetrates the transparent insulating films 51A and 51B is formed.

Figure 16B:
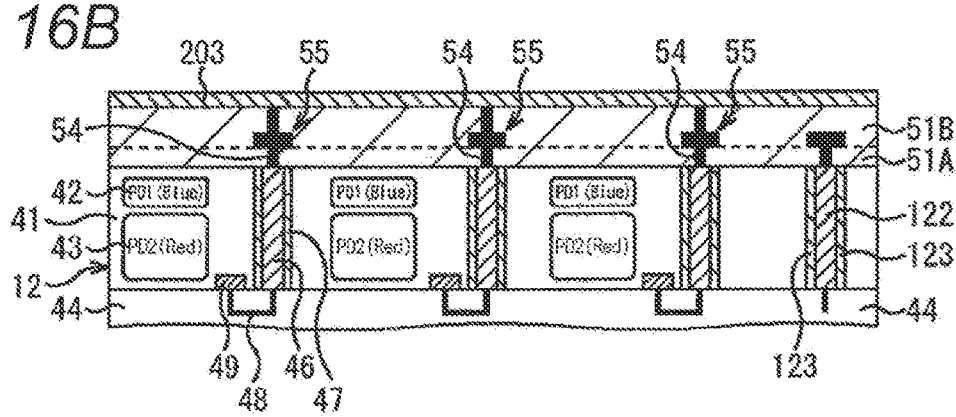
Figure 16C:
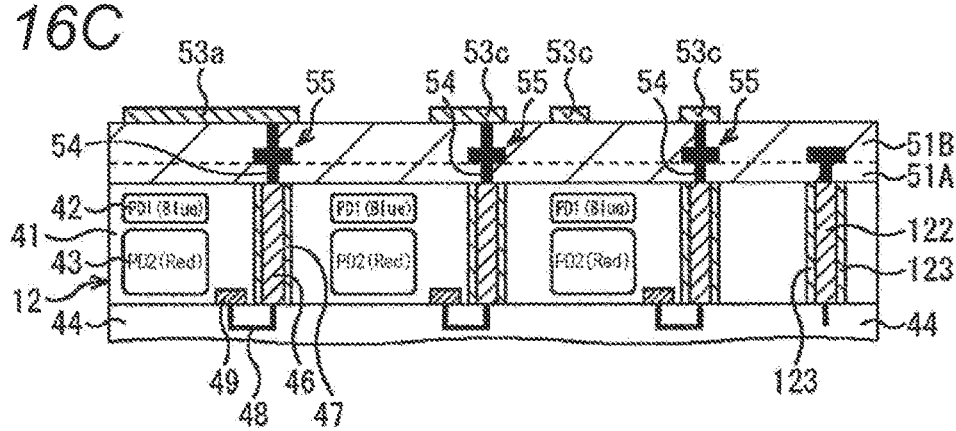

Then, as illustrated in FIG. 16B, on the transparent insulating film 51B, for example, an indium tin oxide (ITO) film 203 is formed, and patterning is performed thereon by the lithography, with only an intended region being left. That is, on the transparent insulating film 51B, a film 203, such as an indium tin oxide (ITO) film, is formed; the film 203 then undergoes patterning and lithography processes such that a region 53a and 53c are formed. Thus, as illustrated in FIG. 16C, a lower electrode 53a of a normal pixel 2X and a lower electrode 53c of a phase difference pixel 2P are formed.

Figure 16D:
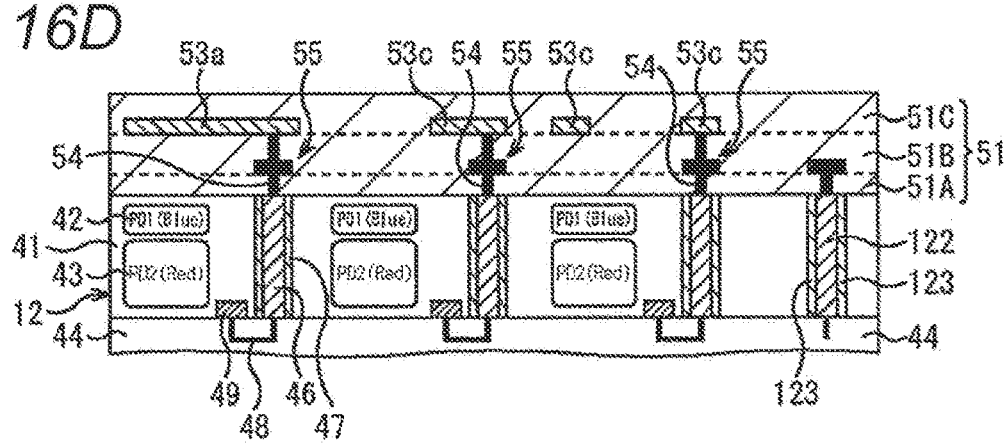
Figure 17A:
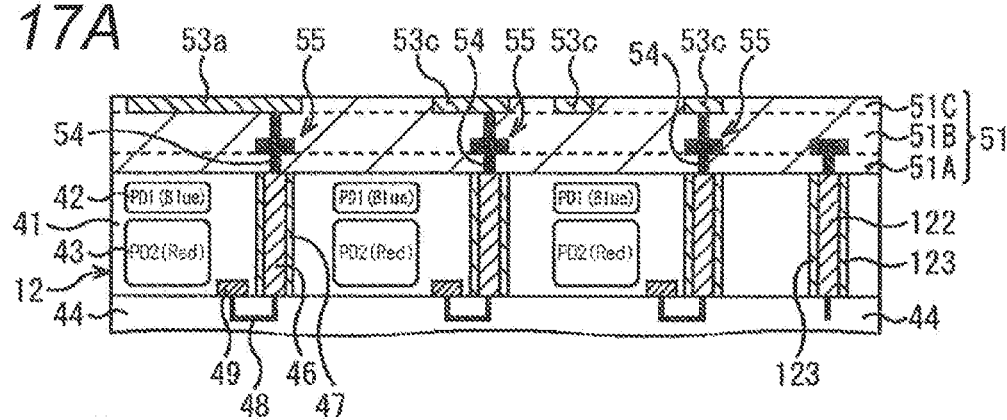
FIG. 17A-17D are illustrations for describing the production method of the first embodiment.

Then, a transparent insulating film 51C is formed having a predetermined thickness on the transparent insulating film 51B and the lower electrodes 53a and 53c as illustrated in FIG. 16D. After the transparent insulating film 51C has been formed, a portion of the transparent insulating film 51C is removed, for example, by chemical mechanical polishing (CMP) until the thickness thereof becomes the same as or similar to the lower electrode 53a and the lower electrode 53c. As a result, and as illustrated in FIG. 17A, the transparent insulating film 51C and the transparent insulating films 51B and 51A, which are the layers under the transparent insulating film 51C, complete the transparent insulating film 51 in FIG. 2.

Figure 17B:
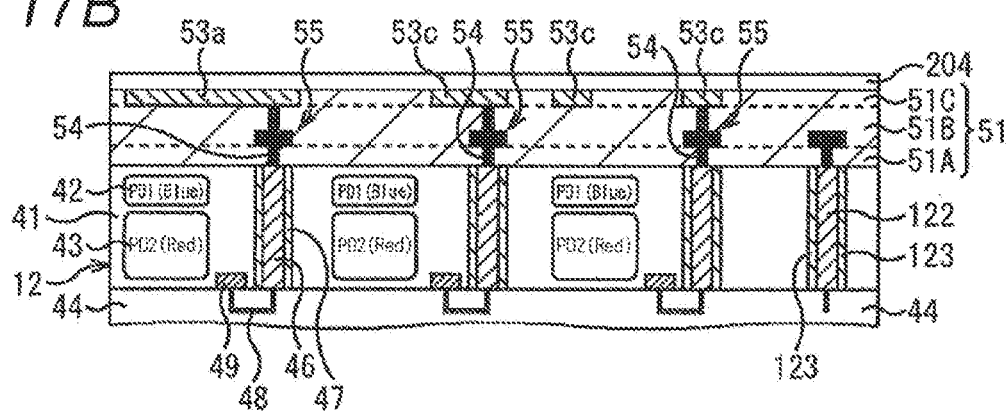
Figure 17C:
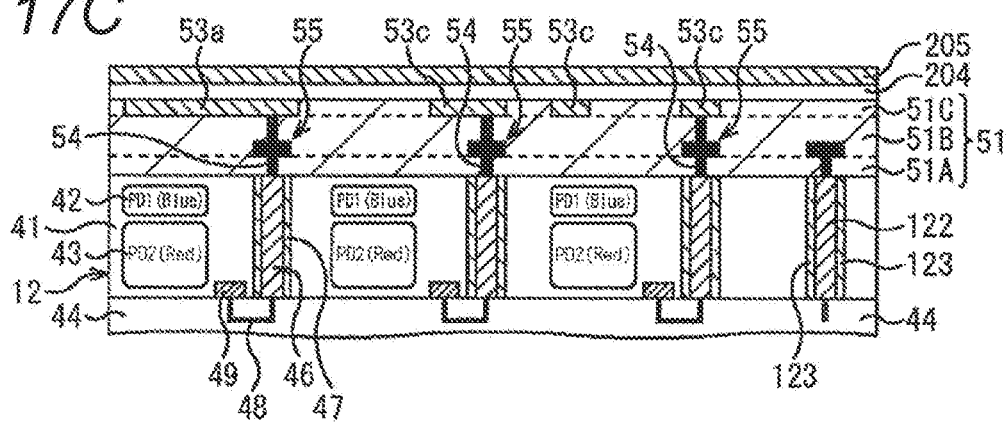

Subsequently, after an organic photoelectric conversion material 204, which photoelectrically converts the green wavelength light, is formed on the upper surfaces of the lower electrodes 53a and 53c and the transparent insulating film 51 as illustrated in FIG. 17B, for example, a film 25, such as an indium tin oxide (ITO) film, is formed thereon, as illustrated in FIG. 17C.

Figure 17D:
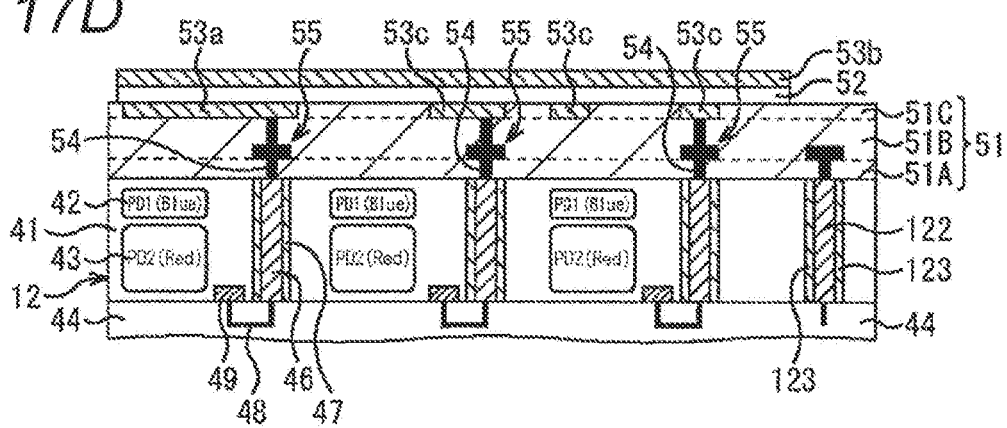

Then, etching is performed with only an intended region being left, whereby an organic photoelectric conversion film 52 and an upper electrode 53b which are common to the normal pixel 2X and the phase difference pixel 2P are completed, as illustrated in FIG. 17D.

Figure 18A:
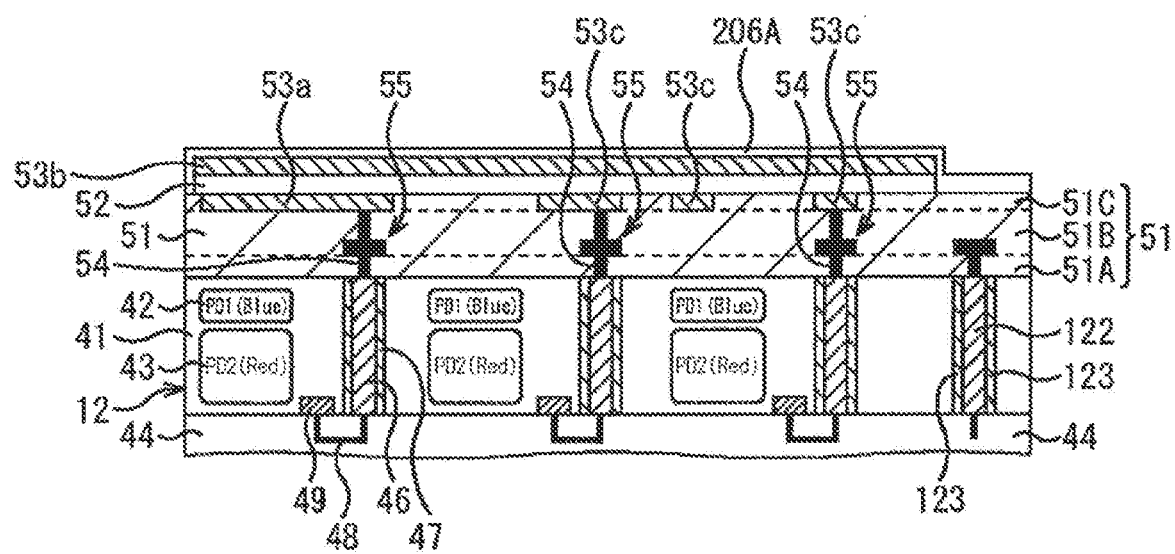
FIG. 18A-18B are illustrations for describing the production method of the first embodiment.

Subsequently, as illustrated in FIG. 18A, a high refractive material 206A, such as a nitride film, is formed on upper surfaces of the upper electrode 53b in a pixel region of a pixel array unit 3 and the transparent insulating film 51 at an outer peripheral part. The refractive material 206A becomes a portion of the high refractive index layer 56.

Figure 18B:
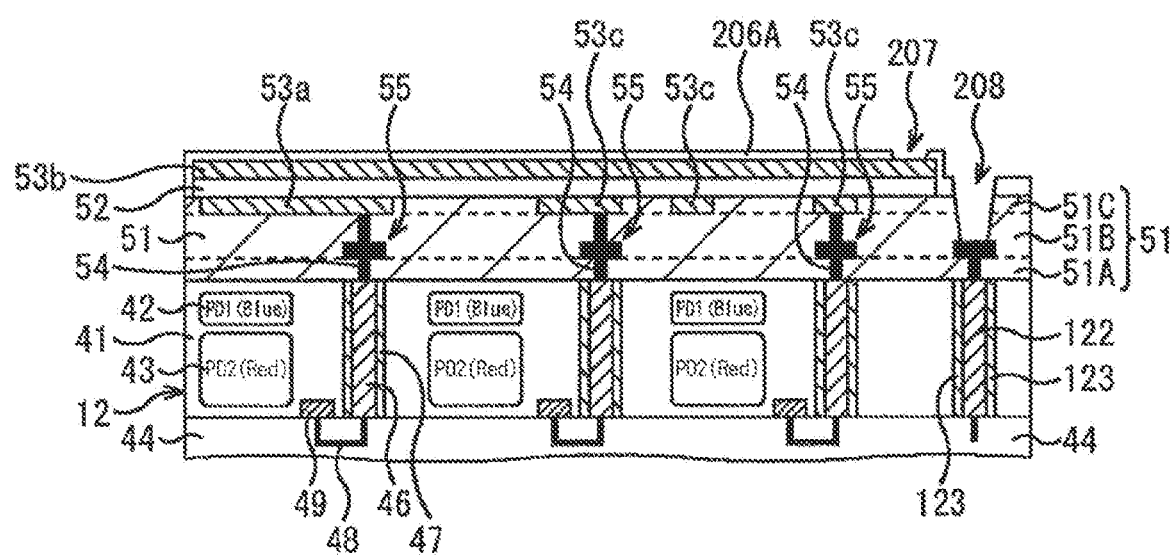

Then, as illustrated in FIG. 18B, an opening 207 is formed at a location which becomes a contact unit of the upper electrode 53b. Additionally, an opening 208 is formed at a location which becomes a contact unit with the conductive plug 122.

Figure 19A:
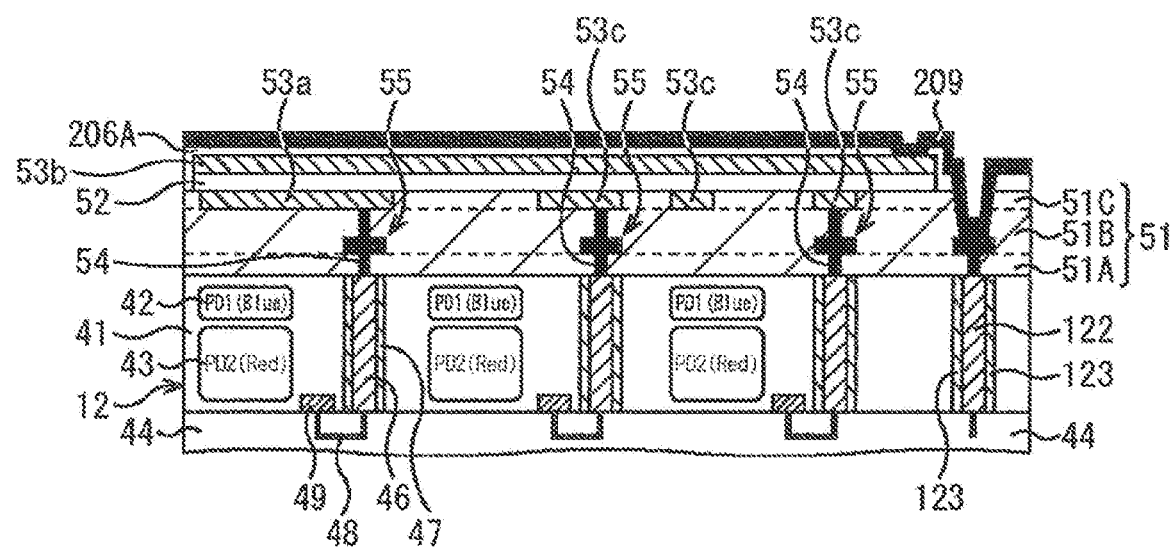
FIG. 19A-19B are illustrations for describing the production method of the first embodiment.
Figure 19B:
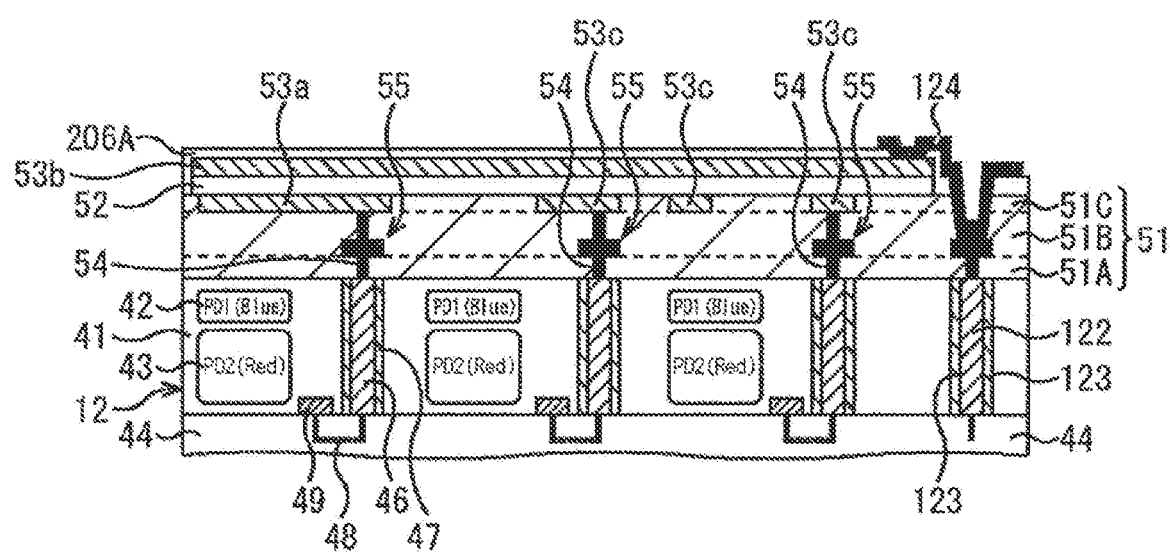

Then, as illustrated in FIG. 19A, after a metal material 209, such as tungsten (W), is formed in a conformal manner on an upper surface of the high refractive material 206A, to which the contact openings 207 and 208 have been formed, patterning is performed in a manner such that the outer peripheral part of the pixel array unit 3 remains. Thus, as illustrated in FIG. 19B, the connection wiring 124 which connects the conductive plug 122 and the upper electrode 53b is completed.

Figure 20A:
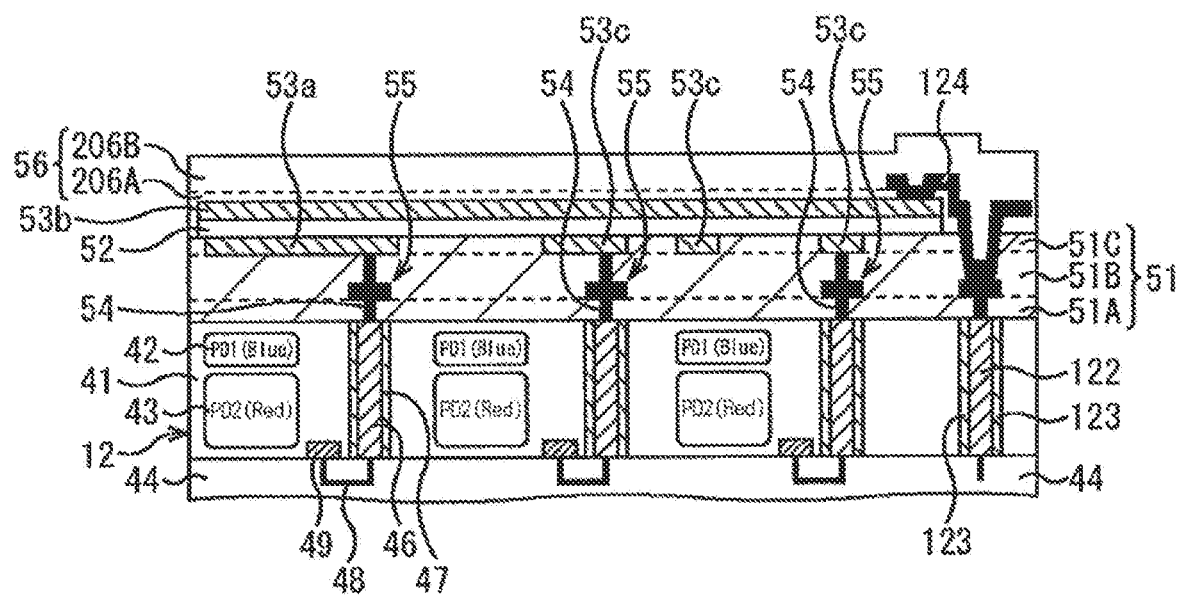
FIG. 20A-20B are illustrations for describing the production method of the first embodiment.

Then, as illustrated in FIG. 20A, on the high refractive material 206A and the connection wiring 124, a high refractive material 206B, which may be the same material as the high refractive material 206A, is formed. The laminated high refractive material 206A and high refractive material 206B configure and/or create the high refractive index layer 56.

Figure 20B:
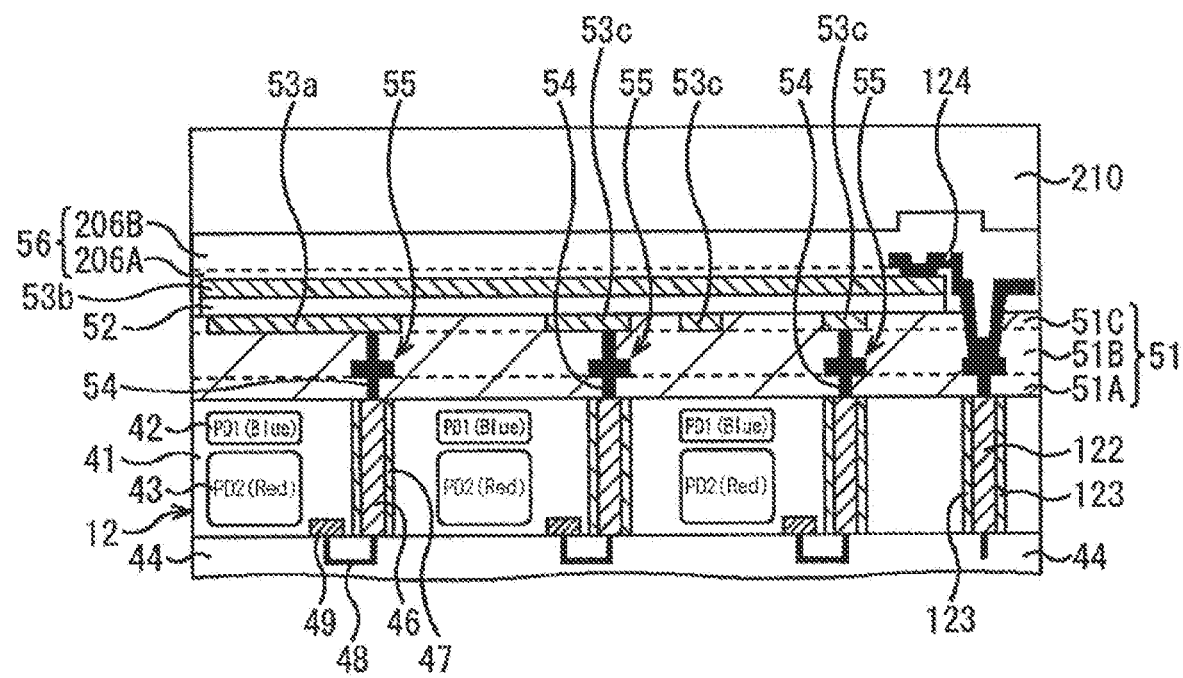
Figure 21A:
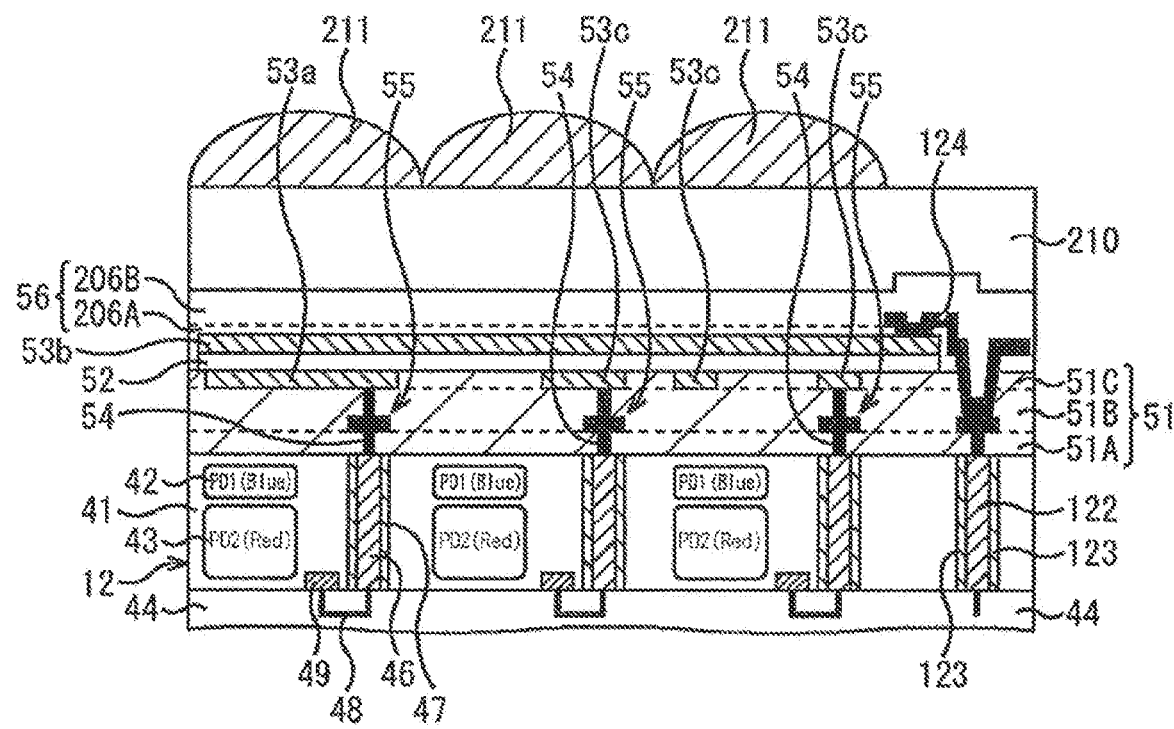
FIG. 21A-21B are illustrations for describing the production method of the first embodiment.
Figure 21B:
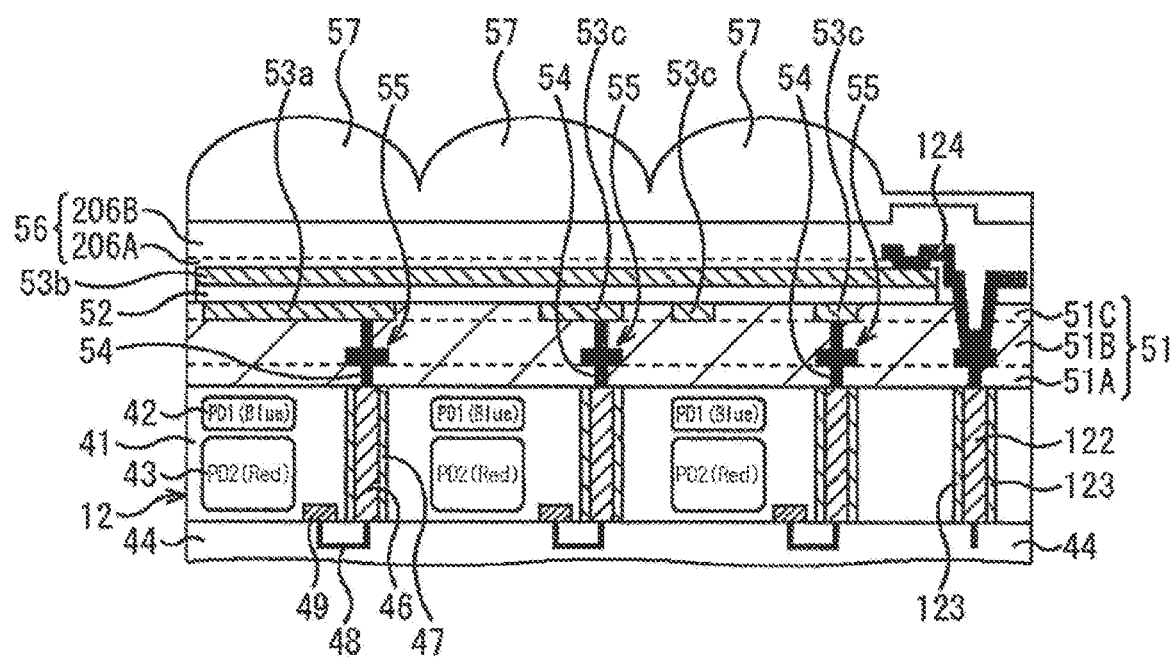

Next, a resin-based material 210, which is a material of an on-chip lens 57, is further formed on an upper surface of the high refractive index layer 56 as illustrated in FIG. 20B. After the resin-based material 210 is formed as illustrated in FIG. 20B, a photoresist 211 is formed in a lens-shape as illustrated in FIG. 21A. Then, by etching back based on the lens-shaped photoresist 211, the on-chip lens 57 is formed on a top of each of the pixels 2, as illustrated in FIG. 21B.

In the manner above, the pixel structure of the first embodiment illustrated in FIG. 2 may be produced.

15. Production Method of the Second Embodiment

Next, a production method of the second embodiment illustrated in FIG. 4 will be described with reference to FIG. 22.

A portion of the second embodiment may be produced in a similar manner as described with respect to FIG. 14A to FIG. 16B of the first embodiment. An ITO film 203 is formed on a whole upper side surface of a transparent insulating film 51B as previously described with respect to FIG. 16B.

Then, patterning is performed, by lithography, on the ITO film 203 formed on the transparent insulating film 51B such that only an intended region remains. Accordingly, lower electrodes 53a having the same shapes are respectively formed for a normal pixel 2X and a phase difference pixel $2P_A$s illustrated in FIG. 22A.

Figure 22A:
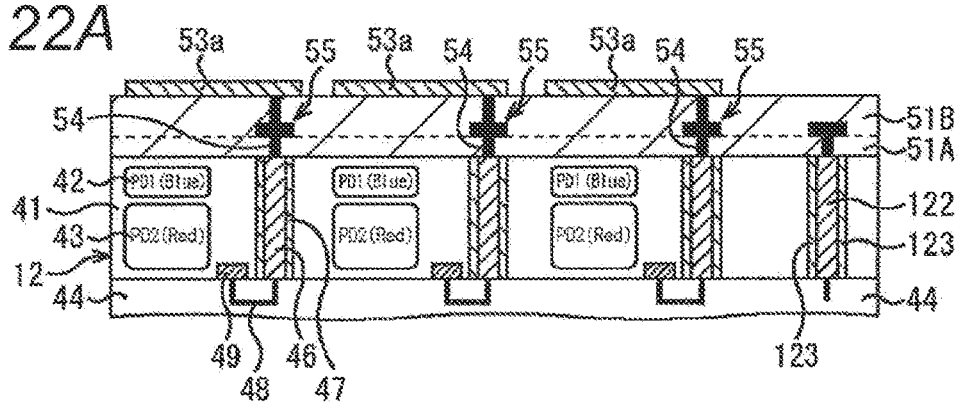
FIG. 22A-22D are illustrations for describing a production method of the second embodiment.
Figure 22B:
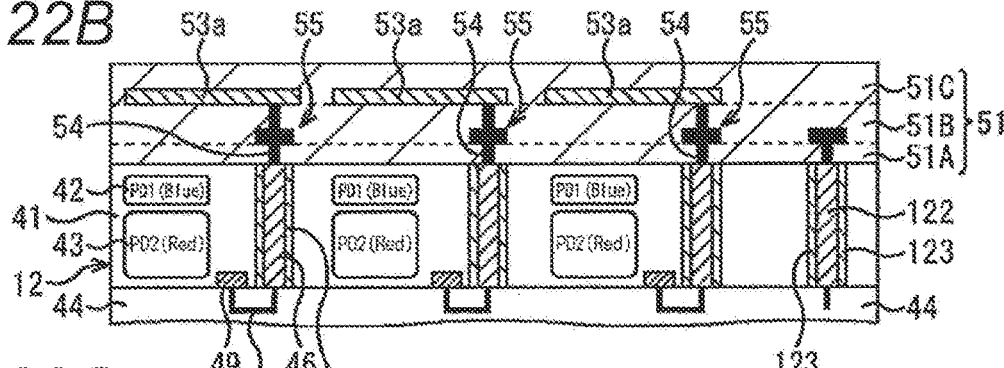

Then, as illustrated in FIG. 22B, on the transparent insulating film 51B and the lower electrode 53a, a transparent insulating film 51C is further formed having a predetermined thickness.

Figure 22C:
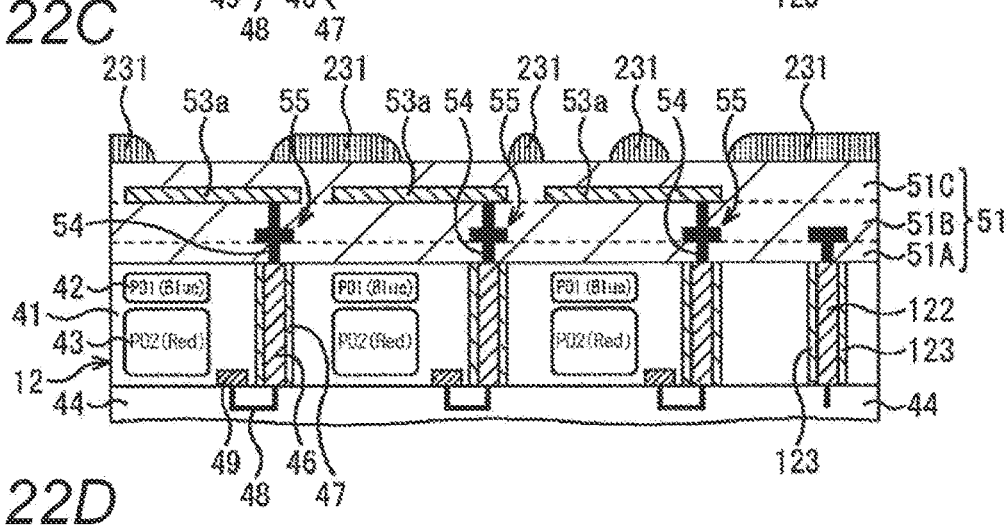

Next, as illustrated in FIG. 22C, patterning is performed on a photoresist 231 based on a formed region of an interlayer film 81. Here, an end surface of the photoresist 231 on which the patterning is performed is reflowed at a high temperature and is formed to have a taper (tilted surface) shape.

Figure 22D:
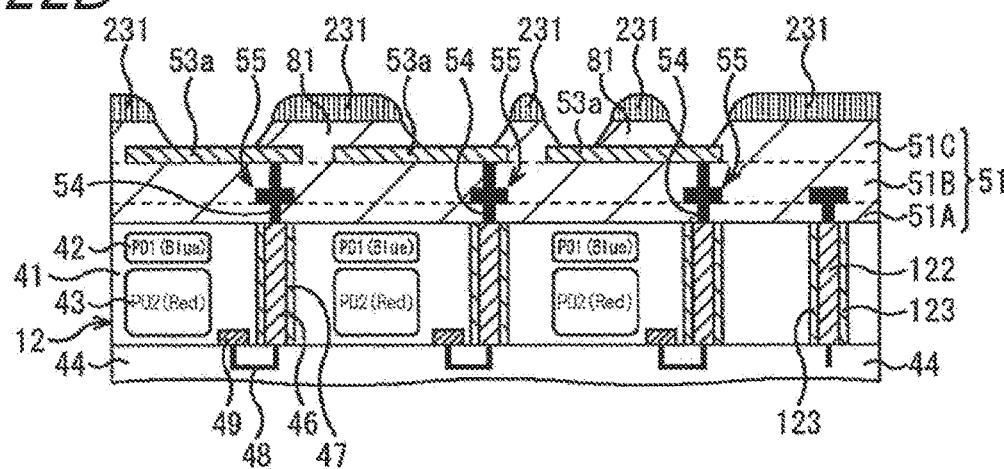

Then, based on the taper (tilted surface) shaped photoresist 231, the transparent insulating film 51C is etched back, and as illustrated in FIG. 22D, the interlayer film 81 is formed on the lower electrode 53a of the phase difference pixel 2P.

After the photoresist 231 is removed, the second embodiment can be produced utilizing processes similar to the processes illustrated in and after FIG. 17A of the first embodiment, and thus, the description thereof is omitted.

16. Production Method of the Ninth Embodiment

Figure 23A:
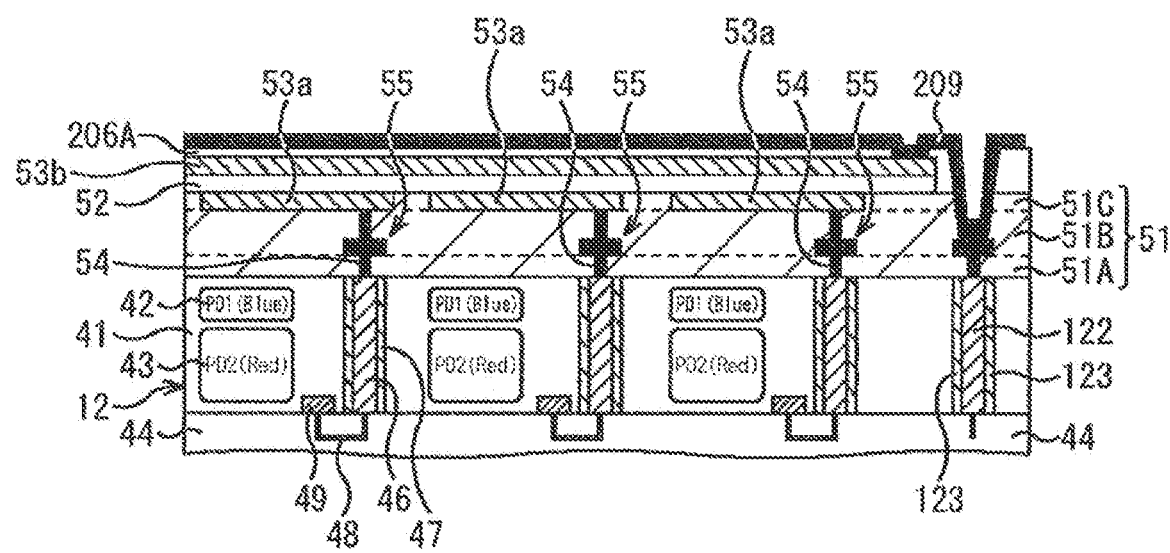
FIG. 23A-23B are illustrations for describing a production method of the ninth embodiment.

Next, a production method of the ninth embodiment illustrated in FIG. 10 will be described with reference to FIG. 23.

A portion of the ninth embodiment may be produced in a similar manner to that of FIG. 14A to 19A of the first embodiment. However, as can be seen from the comparison between FIG. 19A and FIG. 23A, in the ninth embodiment illustrated in FIG. 23A, for a phase difference pixel $2P_A$ lower electrode 53a having the same shape with that of a normal pixel 2X is formed instead of the lower electrode 53c.

Figure 23B:
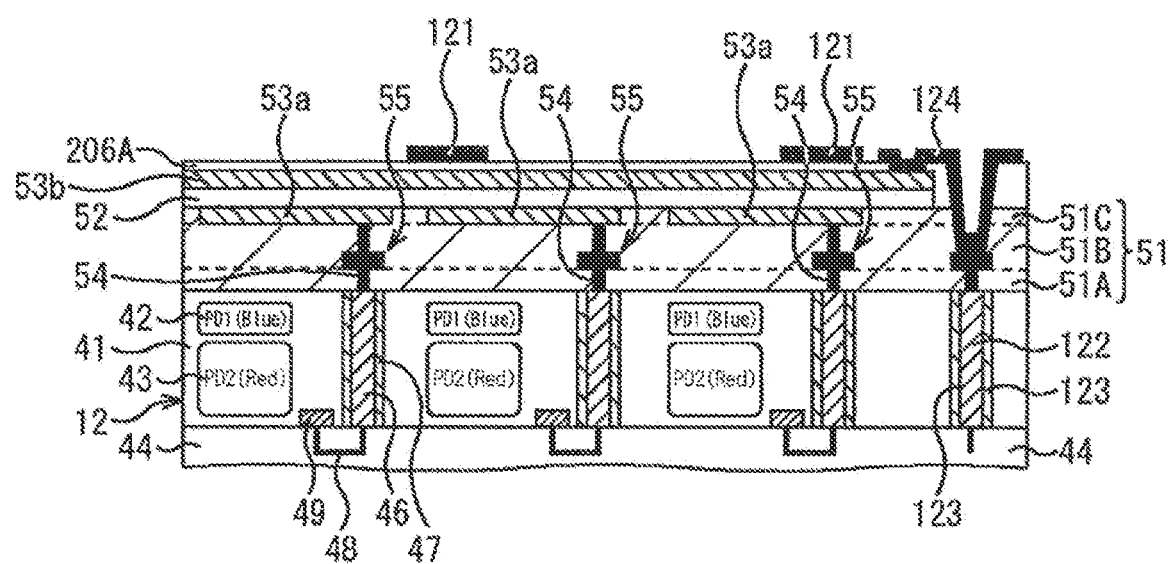

As illustrated in FIG. 23B, patterning is performed on a metal material 209 by lithography such that an intended region remains. Thus, connection wiring 124 is formed, and light shielding films 121 are formed respectively at predetermined regions in a phase difference pixel $2P_A$ and a phase difference pixel $2P_B$.

Processes after the intermediate state illustrated in FIG. 23B is similar to those illustrated in and after FIG. 20A of the first embodiment, and thus, the description thereof is omitted.

Application Example to Electronic Device

Application of a technique of the present disclosure is not limited to a solid-state imaging element. That is, the technique of the present disclosure is applicable to a general electronic device using a solid-state imaging element as an image reading unit (photoelectric conversion unit). For example, the general electronic device may be an imaging apparatus such as a digital still camera or a video camera, a portable terminal apparatus including an imaging function, or a copier using a solid-state imaging element as an image reading unit. The solid-state imaging element may be formed as one chip, or may be a module including an imaging function, in which an imaging unit and a signal processing unit and/or an optical system are packaged together.

Figure 24:
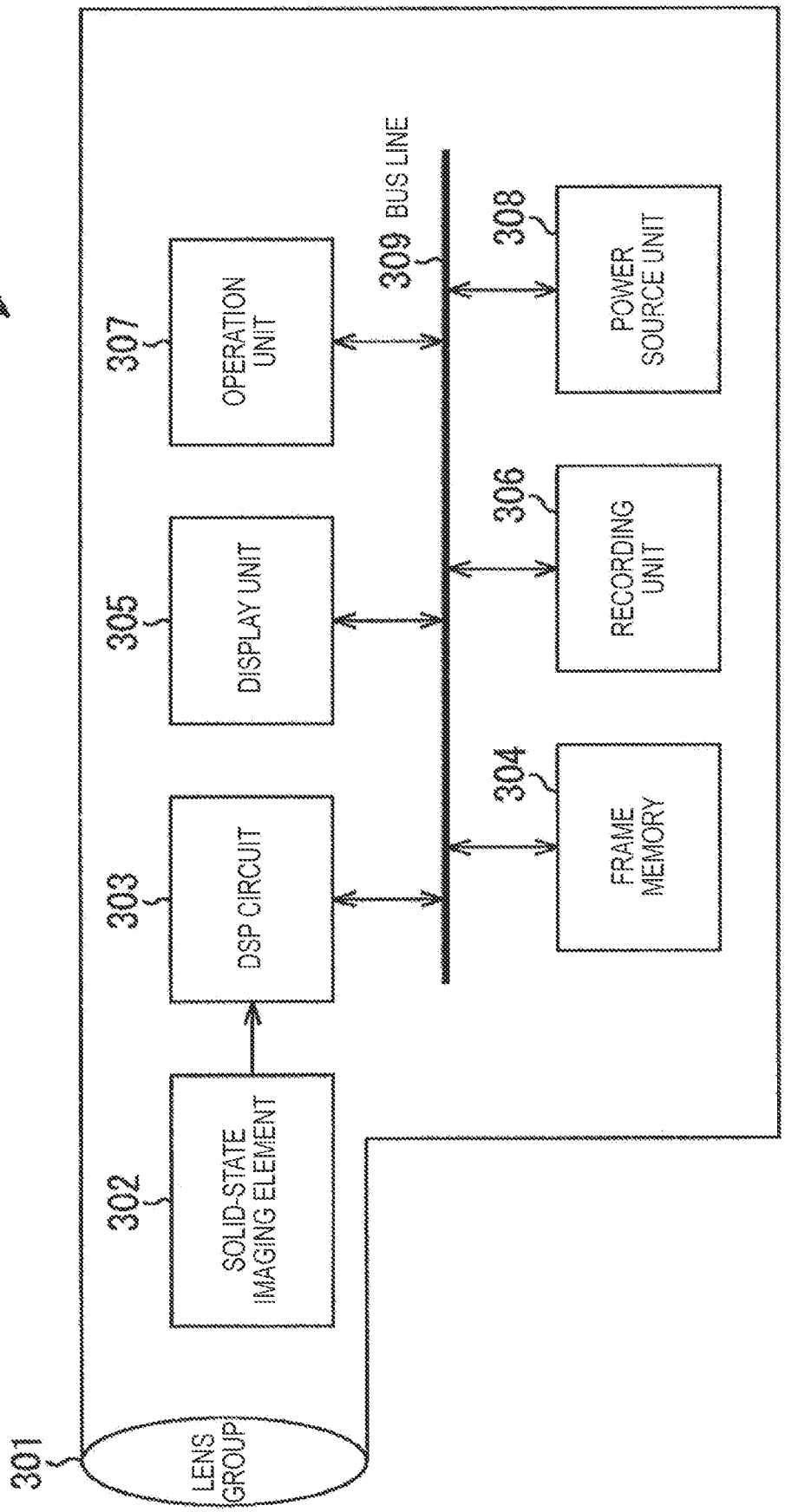
FIG. 24 is a block diagram illustrating a configuration example of an imaging apparatus as an electronic device according to an embodiment of the present disclosure.

FIG. 24 is a block diagram illustrating a configuration example of an imaging apparatus as an electronic device according to an embodiment of the present disclosure.

An imaging apparatus 300 in FIG. 24 includes an optical unit 301 including a lens group and the like, a solid-state imaging element (imaging device) 302 in which a configuration of the solid-state imaging element 1 in FIG. 1 is employed, and a digital signal processor (DSP) circuit 303 which may be a camera signal processing circuit. The imaging apparatus 300 also includes a frame memory 304, a display unit 305, a recording unit 306, an operation unit 307, and a power source unit 308. The DSP circuit 303, the frame memory 304, the display unit 305, the recording unit 306, the operation unit 307, and the power source unit 308 are connected mutually through a bus line 309.

The optical unit 301 receives incident light (image light) from an object and forms an image on an imaging surface of the solid-state imaging element 302. The solid-state imaging element 302 converts, in a pixel unit, the quantity of incident light of the image formed on the imaging surface by the optical unit 301 into an electric signal, and outputs the signal as a pixel signal. As the solid-state imaging element 302, the solid-state imaging element 1 in FIG. 1, that is, a solid-state imaging element of a longitudinal-direction spectral type including a phase difference pixel 2P and a normal pixel 2X, can be used.

The display unit 305 includes, for example, a panel-type display apparatus such as a liquid crystal panel, or an organic electro luminescence (EL) panel, and displays a moving image or a still image imaged in the solid-state imaging element 302. The recording unit 306 records a moving image or a still image imaged in the solid-state imaging element 302 into a recording medium such as a hard disk or a semiconductor memory.

Following an operation by a user, the operation unit 307 issues an operation instruction with respect to various functions which the imaging apparatus 300 is configured to perform. The power source unit 308 arbitrarily supplies various power sources, which become operation power sources of the DSP circuit 303, the frame memory 304, the display unit 305, the recording unit 306, and the operation unit 307, to these objects of the supply.

As described above, by employing, as the solid-state imaging element 302, the solid-state imaging element 1 according to each of the embodiments, it becomes possible to realize a phase difference pixel without increasing the number of processes. Thus, also in the imaging apparatus 300, such as a video camera, a digital still camera, and a camera module for a mobile device such as a mobile phone, it becomes possible to enhance quality of an imaged image.

Embodiments of the present disclosure are not limited to the above described embodiments, and various modifications may be made thereto without departing from the scope of the present disclosure.

In each of the embodiments, a solid-state imaging element of a longitudinal-direction spectral type, which includes one organic photoelectric conversion layer (organic photoelectric conversion film 52) on an upper layer of a semiconductor substrate 12 and two inorganic photoelectric conversion layers (photodiode PD1 and PD2) in the semiconductor substrate 12, has been described.

However, the technique of the present disclosure is similarly applicable to a solid-state imaging element of a longitudinal-direction spectral type, which includes two organic photoelectric conversion layers on an upper layer of a semiconductor substrate 12 and one inorganic photoelectric conversion layer in the semiconductor substrate 12.

Also, in each of the embodiments, an example of a phase difference pixel 2P having a right-left direction (horizontal direction) as a shielding direction has been described. However, the shielding direction is not limited to the right-left direction (horizontal direction), and may be an upward-downward direction (vertical direction) or a diagonal direction.

Moreover, in each of the embodiments, an upper electrode 53b is formed on a whole surface and is common to all pixels, and a lower electrode 53a is formed in a pixel unit, the upper electrode 53b and the lower electrode 53a con-figuring an organic photoelectric conversion unit. However, the upper electrode 53b may be formed in a pixel unit and the lower electrode 53a may be formed on a whole surface and common to all pixels.

In each of the described examples, a solid-state imaging element, in which a first conductivity type is a p-type, a second conductivity type is an n-type, and an electron is signal charge, has been described. However, a technique of the present disclosure can also be applied to a solid-state imaging element in which a hole is signal charge. That is, the semiconductor regions described above can be configured by the opposite conductivity types, with the first conductivity type being the n-type and the second conductivity type being the p-type.

In addition, the technique of the present disclosure is applicable not only to a solid-state imaging element which detects a distribution of incident light and a quantity of visible light and images as an image, but also to a solid-state imaging element which images a distribution of incident and a quantity of infrared light, X-rays, particles, and/or the like. Also, in a broad sense, the technique of the present disclosure is applicable to a general solid-state imaging element (physical quantity distribution detection apparatus), such as a fingerprint detecting sensor, which detects distribution of other physical quantity such as pressure or electric capacitance and images as an image.

Note that the effects described in the present specification are examples, and are not limitations. There may be an effect which is not described in the present specification.

The present disclosure can also be in the following configurations.

(1) A solid-state imaging element including: a phase difference pixel which at least includes a photoelectric conversion unit arranged on an upper side of a semiconductor substrate on a side of a light incident surface, the photoelectric conversion unit including a photoelectric conversion film and upper and lower electrodes which sandwich the photoelectric conversion film and at least one of which has a shape separated for each pixel, wherein the photoelectric conversion units of a pair of the phase difference pixels have different photoelectrically converted regions.

(2) The solid-state imaging element according to (1), wherein the photoelectric conversion units of the paired phase difference pixels include different shapes of the electrode, which has a shape separated for each pixel.

(3) The solid-state imaging element according to (1) or (2), wherein the electrode, which has a shape separated for each pixel, of the photoelectric conversion unit is divided into at least two in the pixel.

(4) The solid-state imaging element according to (3), wherein one of the two divided electrodes is connected to a fixed electric potential.

(5) The solid-state imaging element according to (1), wherein the photoelectric conversion units of the paired phase difference pixels have different contact positions between the electrode, which has a shape separated for each pixel, and the photoelectric conversion film.

(6) The solid-state imaging element according to (1), wherein the phase difference pixel further includes, on an upper side of the photoelectric conversion unit, a light shielding film configured to block incident light, and the paired phase difference pixels have different arrangements of the light shielding film.

(7) The solid-state imaging element according to (6), wherein the light shielding film is electrically connected to the electrode on the side of the light incident surface.
(8) The solid-state imaging element according to any one of (1) to (7), wherein the photoelectric conversion film is configured to convert green wavelength light photoelectrically.
(9) The solid-state imaging element according to (8), wherein the phase difference pixel further includes an inorganic photoelectric conversion unit in the semiconductor substrate, and the inorganic photoelectric conversion unit is configured to convert red and blue wavelength light photoelectrically.
(10) The solid-state imaging element according to any one of (1) to (9), wherein the photoelectric conversion film is capable of converting red, green, and blue wavelength light photoelectrically.
(11) The solid-state imaging element according to (10), wherein a red, green, or blue color filter is arranged on an upper side of the photoelectric conversion film, and the photoelectric conversion film is configured to photoelectrically convert light having passed through the color filter.
(12) The solid-state imaging element according to any one of (1) to (11), further including a high refractive index layer on an upper side of the photoelectric conversion unit.
(13) A production method of a solid-state imaging element, including: forming a phase difference pixel, which at least includes a photoelectric conversion unit arranged on an upper side of a semiconductor substrate on a side of a light incident surface, in such a manner that the photoelectric conversion units of a pair of the phase difference pixels have different photoelectrically converted regions, the photoelectric conversion unit including a photoelectric conversion film and upper and lower electrodes which sandwich the photoelectric conversion film and at least one of which has a shape separated for each pixel.
(14) An electronic device including: a solid-state imaging element including a phase difference pixel which at least includes a photoelectric conversion unit arranged on an upper side of a semiconductor substrate on a side of a light incident surface, the photoelectric conversion unit including a photoelectric conversion film and upper and lower electrodes which sandwich the photoelectric conversion film and at least one of which has a shape separated for each pixel, wherein the photoelectric conversion units of a pair of the phase difference pixels have different photoelectrically converted regions.
(15) A solid-state imaging element including a phase difference pixel which includes an inorganic photoelectric conversion unit formed in a semiconductor substrate, and an organic photoelectric conversion unit arranged on an upper side of the semiconductor substrate on a side of a light incident surface, the organic photoelectric conversion unit including an organic photoelectric conversion film and upper and lower electrodes which sandwich the organic photoelectric conversion film and at least one of which has a shape separated for each pixel, wherein the inorganic photoelectric conversion units of a pair of the phase difference pixels have different photoelectrically converted regions.
(16) The solid-state imaging element according to (15), wherein the phase difference pixel further includes, between the semiconductor substrate and the organic photoelectric conversion unit, a light shielding film configured to shield a part of the inorganic photoelectric conversion unit, and the paired phase difference pixels have different arrangements of the light shielding film.
(17) The solid-state imaging element according to (15), wherein the inorganic photoelectric conversion units of the paired phase difference pixels are formed at different positions.
(18) The solid-state imaging element according to any one of (15) to (17), wherein the organic photoelectric conversion film is configured to convert green wavelength light photoelectrically.
(19) The solid-state imaging element according to any one of (15) to (18), wherein the inorganic photoelectric conversion unit is configured to convert at least one of red and blue wavelength light photoelectrically.
(20) The solid-state imaging element according to any one of (15) to (17), wherein the organic photoelectric conversion film is capable of converting red, green, and blue wavelength light photoelectrically.
(21) The solid-state imaging element according to (20), wherein a red, green, or blue color filter is arranged on an upper side of the organic photoelectric conversion film, and the organic photoelectric conversion film is configured to photoelectrically convert light having passed through the color filter.
(22) The solid-state imaging element according to any one of (15) to (17), (20), and (21), wherein the inorganic photoelectric conversion unit is configured to convert infrared light photoelectrically.
(23) The solid-state imaging element according to any one of (15) to (22), further including a high refractive index layer on an upper side of the organic photoelectric conversion unit.
(24) A production method of a solid-state imaging element, including: forming a phase difference pixel, which includes an inorganic photoelectric conversion unit formed in a semiconductor substrate, and an organic photoelectric conversion unit arranged on an upper side of the semiconductor substrate on a side of a light incident surface, in such a manner that the inorganic photoelectric conversion units of a pair of the phase difference pixels have different photoelectrically converted regions, the organic photoelectric conversion unit including an organic photoelectric conversion film and upper and lower electrodes which sandwich the organic photoelectric conversion film and at least one of which has a shape separated for each pixel.
(25) An electronic device including: a solid-state imaging element including a phase difference pixel which includes an inorganic photoelectric conversion unit formed in a semiconductor substrate, and an organic photoelectric conversion unit arranged on an upper side of the semiconductor substrate on a side of a light incident surface, the organic photoelectric conversion unit including an organic photoelectric conversion film and upper and lower electrodes which sandwich the organic photoelectric conversion film and at least one of which has a shape separated for each pixel, wherein the inorganic photoelectric conversion units of a pair of the phase difference pixels have different photoelectrically converted regions.

(26) A solid-state imaging element comprising:
a phase difference detection pixel pair including first and second phase difference detection pixels, each phase difference detection pixel of the first and second phase difference detection pixels including a first photoelectric conversion unit arranged at an upper side of a semiconductor substrate and a second photoelectric conversion unit arranged within the semiconductor substrate, wherein the first photoelectric conversion unit includes a first photoelectric conversion film sandwiched between an upper electrode and a lower electrode.

(27) The solid-state imaging element according to (26), wherein a majority of the photoelectric conversion unit of the first phase difference detection pixel is above a left portion of the second photoelectric conversion unit of the first phase difference detection pixel and a majority of the photoelectric conversion unit of the second phase difference detection pixel is above a right portion of the second photoelectric conversion unit of the first phase difference detection pixel.

(28) The solid-state imaging element according to any one of (26) and (27), further comprising an insulating film disposed between two photoelectric conversion regions of the first photoelectric conversion unit of at least one of the first and second phase difference detection pixels.

(29) The solid-state imaging element according to (28), wherein a first of the two regions of the first photoelectric conversion unit is above a left portion of the second photoelectric conversion unit of the first phase difference detection pixel.

(30) The solid-state imaging element according to any one of (26) to (29), wherein the first photoelectric conversion film includes an organic photoelectric conversion film.

(31) The solid-state imaging element according to any one of (26) to (30), wherein the second photoelectric conversion unit includes an inorganic photoelectric conversion film disposed within the semiconductor substrate.

(32) The solid-state imaging element according to any one of (26) to (31), wherein each of the first and second phase detection pixels includes a floating diffusion region configured to accumulate a charge from the first photoelectric conversion unit, the floating diffusion region located within the semiconductor substrate.

(33) The solid-state imaging element according to any one of (26) to (32), wherein a portion of the lower electrode in each of the first and second phase detection pixels is connected to a semiconductor region of a predetermined potential.

(35) The solid-state imaging element according to (34), wherein the predetermined potential is a ground (GND) potential.

(36) The solid-state imaging element according to (26), (27) and/or (30) to (32), wherein
in a left-half region of the first photoelectric conversion unit of the first phase difference detection pixel, the lower electrode is in contact with the photoelectric conversion film,
in a right-half region of the first photoelectric conversion unit of the first phase difference detection pixel, the lower electrode is not in contact with the photoelectric conversion film,
in a right-half region of the first photoelectric conversion unit of the second phase difference detection pixel, the lower electrode is in contact with the photoelectric conversion film, and
in a left-half region of the first photoelectric conversion unit of the second phase difference detection pixel, the lower electrode is not in contact with the photoelectric conversion film.

(37) The solid-state imaging element according to (36), wherein
in the right-half region of the first photoelectric conversion unit of the first phase difference detection pixel, the lower electrode is in contact with an interlayer film, and
in a left-half region of the first photoelectric conversion unit of the second phase difference detection pixel, the lower electrode is in contact with an interlayer film.

(38) The solid-state imaging element according to (26), wherein the second photoelectric conversion unit occupies a left-half portion of the first phase difference detection pixel, and wherein the second photoelectric conversion unit occupies a right-half portion of the second phase difference detection pixel.

(39) The solid-state imaging element according to (26) and/or (38), further including an image generation pixel including a first photoelectric conversion unit arranged at the upper side of the semiconductor substrate and configured to photoelectrically convert the first wavelength of light and a second photoelectric conversion unit arranged within the semiconductor substrate and configured to photoelectrically convert the second wavelength of light,
wherein the second photoelectric conversion units of the first and second phase difference detection pixels are smaller than the second photoelectric conversion unit of the image generation pixel.

(40) The solid-state imaging element according to any one of (26) to (39), further including a plurality of image generation pixels and a plurality of phase difference detection pixels, wherein the upper electrode is common to the plurality of image generation pixels and the plurality of phase difference detection pixels, and wherein the lower electrode is not common to the plurality of image generation pixels and the plurality of phase difference detection pixels.

(41) The solid-state imaging element according to any one of (26) to (40), wherein each of the first and second phase difference detection pixels include a third photoelectric conversion unit configured to photoelectrically convert a third wavelength of light, wherein the third photoelectric conversion unit is below the second photoelectric conversion unit.

(42) The solid-state imaging element according to any one of (26) to (41), wherein the first photoelectric conversion unit photoelectrically converts green light, the second photoelectric conversion unit photoelectrically converts blue light, and the third photoelectric conversion unit photoelectrically converts red light.

(43) The solid-state imaging element according to any one of (26) to (42), further including a light-shielding film arranged between the first and second phase difference detection pixels.

(44) The solid-state imaging element according to (43), wherein the light-shielding film transfers charge accumulated in the first photoelectric conversion unit to a floating diffusion region via a conductive plug and metal wiring.

(45) An electronic device comprising:
a solid state imaging element including a phase difference detection pixel pair including first and second phase difference detection pixels, each phase difference detection pixel of the first and second phase difference detection pixels including a first photoelectric conversion unit arranged at an upper side of a semiconductor substrate and a second photoelectric conversion unit arranged within the semiconductor substrate, wherein the first photoelectric conversion unit includes a first photoelectric conversion film sandwiched between an upper electrode and a lower electrode; and
an optical unit configured to receive incident light and form an image on an imaging surface of the solid-state imaging element.
(46) A method of manufacturing a solid-state imaging device, the method comprising:
forming a plurality of first photoelectric conversion units within a semiconductor substrate, the first photoelectric conversion units configured to photoelectrically convert a first wavelength of light; forming a plurality of second photoelectric conversion units above the semiconductor substrate, wherein the plurality of second photoelectric conversion units are configured to photoelectrically convert a second wavelength of light.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST 1 solid-state imaging element
2 PIXEL
2X normal pixel
2P phase difference pixel
3 PIXEL ARRAY UNIT
12 semiconductor substrate
PD1, PD2 photodiode
41 to 43 semiconductor region
52 organic photoelectric conversion film
53a lower electrode
53b upper electrode
53c lower electrode
56 high refractive index layer
57 on-chip lens
71 lower electrode
81 interlayer film
91 organic photoelectric conversion film
92 color filter
101 light shielding film
111,112 semiconductor region
121 light shielding film
PD3 photodiode
131,141 semiconductor region
300 Imaging apparatus
302 solid-state imaging element

The invention claimed is:
1. A light detecting device, comprising:
a first photoelectric conversion unit disposed above a substrate, the first photoelectric conversion unit comprising:
an upper electrode;
a lower electrode comprising a first portion and a second portion; and
a photoelectric conversion film disposed between the upper electrode and the lower electrode;
an on-chip lens disposed above the first photoelectric conversion unit and overlapping the first portion and the second portion of the lower electrode in a plan view;
a first semiconductor region disposed in the substrate and electrically connected to the first portion of the lower electrode; and
a second semiconductor region disposed in the substrate and electrically connected to the second portion of the lower electrode, wherein the second semiconductor region is connected to a fixed electric potential.

2. The light detecting device according to claim 1, further comprising:
a second photoelectric conversion unit disposed in the substrate, wherein the second photoelectric conversion unit overlaps the first portion and the second portion of the lower electrode in the plan view.

3. The light detecting device according to claim 1, further comprising:
a first conductor penetrating the substrate, wherein the first semiconductor region is electrically connected to the first portion of the lower electrode via the first conductor.

4. The light detecting device according to claim 3, further comprising:
a second conductor that electrically connects the second portion of the lower electrode to the second semiconductor region.

5. The light detecting device according to claim 4, further comprising:
a wiring layer on the substrate, wherein the second conductor is disposed in the wiring layer.

6. The light detecting device according to claim 5, further comprising:
a third conductor disposed in the wiring layer, wherein the third conductor is electrically connected to the first conductor.

7. The light detecting device according to claim 1, wherein the first semiconductor region corresponds to a floating diffusion region for the first photoelectric conversion unit.

8. The light detecting device according to claim 1, wherein the fixed electric potential is a ground potential.

9. The light detecting device according to claim 2, further comprising:
a third photoelectric conversion unit disposed in the substrate, wherein the third photoelectric conversion unit overlaps the second photoelectric conversion unit in the plan view.

10. The light detecting device of claim 1, wherein the first portion of the lower electrode is electrically insulated from the second portion of the lower electrode.

11. The light detecting device according to claim 1, wherein the first portion and the second portion of the lower electrode overlap the photoelectric conversion film in the plan view.

12. A light detecting apparatus, comprising:
a light detecting device including:
a first photoelectric conversion unit disposed above a substrate, the first photoelectric conversion unit comprising:
an upper electrode;
a lower electrode comprising a first portion and a second portion; and a photoelectric conversion film disposed between the upper electrode and the lower electrode;

an on-chip lens disposed above the first photoelectric conversion unit and overlapping the first portion and the second portion of the lower electrode in a plan view;

a first semiconductor region disposed in the substrate and electrically connected to the first portion of the lower electrode; and a second semiconductor region disposed in the substrate and electrically connected to the second portion of the lower electrode, wherein the second semiconductor region is connected to a fixed electric potential; and a digital signal processor.

13. The light detecting apparatus according to claim 12, further comprising:

a second photoelectric conversion unit disposed in the substrate, wherein the second photoelectric conversion unit overlaps the first portion and the second portion of the lower electrode in the plan view.

14. The light detecting apparatus according to claim 12, further comprising:

a first conductor penetrating the substrate, wherein the first semiconductor region is electrically connected to the first portion of the lower electrode via the first conductor.

15. The light detecting apparatus according to claim 14, further comprising:

a second conductor that electrically connects the second portion of the lower electrode to the second semiconductor region.

16. The light detecting apparatus according to claim 15, further comprising:

a wiring layer on the substrate, wherein the second conductor is disposed in the wiring layer.

17. The light detecting apparatus according to claim 16, further comprising:

a third conductor disposed in the wiring layer, wherein the third conductor is electrically connected to the first conductor.

18. The light detecting apparatus according to claim 12, wherein the first semiconductor region corresponds to a floating diffusion region for the first photoelectric conversion unit.

19. The light detecting apparatus according to claim 12, wherein the fixed electric potential is a ground potential.

20. The light detecting apparatus according to claim 13, further comprising:

a third photoelectric conversion unit disposed in the substrate, wherein the third photoelectric conversion unit overlaps the second photoelectric conversion unit in the plan view.

21. The light detecting apparatus of claim 12, wherein the first portion of the lower electrode is electrically insulated from the second portion of the lower electrode.

22. The light detecting apparatus according to claim 12, wherein the first portion and the second portion of the lower electrode overlap the photoelectric conversion film in the plan view.

* * * * *